(12) United States Patent
Fantoni

(10) Patent No.: US 10,359,462 B2
(45) Date of Patent: Jul. 23, 2019

(54) METHOD AND SYSTEM FOR MONITORING A CONDITION OF ELECTRICAL CABLES

(71) Applicant: Wirescan AS, Vinterbro (NO)

(72) Inventor: Paolo Franco Fantoni, Genoa (IT)

(73) Assignee: WIRESCAN AS, Trollaasen (NO)

( * ) Notice: Subject to any disclaimer, the term of this patent is extended or adjusted under 35 U.S.C. 154(b) by 246 days.

(21) Appl. No.: 14/437,977

(22) PCT Filed: Oct. 23, 2013

(86) PCT No.: PCT/NO2013/050182
§ 371 (c)(1),
(2) Date: Apr. 23, 2015

(87) PCT Pub. No.: WO2014/065674
PCT Pub. Date: May 1, 2014

(65) Prior Publication Data
US 2015/0253370 A1    Sep. 10, 2015

(30) Foreign Application Priority Data
Oct. 24, 2012   (NO) .................................. 20121245

(51) Int. Cl.
*G01R 31/02* (2006.01)
*G01R 31/11* (2006.01)
(Continued)

(52) U.S. Cl.
CPC ........... *G01R 31/021* (2013.01); *G01R 27/04* (2013.01); *G01R 31/11* (2013.01); *G01R 31/1272* (2013.01); *G01R 31/14* (2013.01)

(58) Field of Classification Search
CPC ............................. G01R 31/021; G01R 31/11
(Continued)

(56) References Cited

U.S. PATENT DOCUMENTS

| 3,904,839 A | 9/1975 | Peoples |
| 4,307,267 A | 12/1981 | Peoples |

(Continued)

FOREIGN PATENT DOCUMENTS

| CN | 1261672 | 8/2000 |
| CN | 101682185 | 3/2010 |

(Continued)

OTHER PUBLICATIONS

Search Report dated Nov. 30, 2016 in corresponding Chinese Application No. 201380065604.8.

(Continued)

*Primary Examiner* — Min Huang
(74) *Attorney, Agent, or Firm* — Wenderoth, Lind & Ponack, L.L.P.

(57) ABSTRACT

A method and a system are described for monitoring a condition of an electrical cable. The method comprises applying a broadband signal wave to a first end of the electrical cable, wherein the broadband signal wave is phase and amplitude modulated and acquiring the phase and amplitude modulated broadband signal wave transmitted and reflected by the electrical cable. Signal analyses is performed which results in establishing a relationship between a real and an imaginary part of a phase impedance spectrum Fourier transform of the power spectrum in an interval around at least one of the locations along the cable, and identifying impedance changes in these locations. Analyzing a second order reflection of the broadband signal in said identified fault locations may establish a local degradation severity of an identified fault in the cable insulation in at least one of the locations along the cable.

28 Claims, 15 Drawing Sheets

Segment with higher impedance, segment longer than LIRA resolution

(51) Int. Cl.
  *G01R 31/12* (2006.01)
  *G01R 31/14* (2006.01)
  *G01R 27/04* (2006.01)
(58) Field of Classification Search
  USPC ........................................................ 324/527
  See application file for complete search history.

(56) References Cited

U.S. PATENT DOCUMENTS

| | | | |
|---|---|---|---|
| 4,630,228 A * | 12/1986 | Tarczy-Hornoch | G01R 23/163 324/542 |
| 4,887,088 A * | 12/1989 | Beckett | G01S 13/341 342/128 |
| 5,479,610 A | 12/1995 | Roll-Mecak et al. | |
| 6,601,001 B1 | 7/2003 | Moore | |
| 7,427,867 B2 * | 9/2008 | Haynes | G01R 31/088 324/527 |
| 7,622,931 B2 * | 11/2009 | Wu | G01R 31/312 324/527 |
| 7,966,137 B2 * | 6/2011 | Fantoni | G01R 27/04 702/59 |
| 8,390,298 B2 | 3/2013 | Kereit et al. | |
| 8,593,153 B2 * | 11/2013 | Medelius | H01B 1/04 324/543 |
| 8,711,711 B2 * | 4/2014 | Kim | H04L 25/0266 340/500 |
| 2004/0039976 A1 * | 2/2004 | Gunther | G01R 31/088 714/742 |
| 2005/0057259 A1 * | 3/2005 | Hornsby | G01R 31/086 324/512 |
| 2007/0152677 A1 | 7/2007 | Barsumian et al. | |
| 2010/0301872 A1 | 12/2010 | Kereit et al. | |
| 2012/0307983 A1 * | 12/2012 | Faulkner | H04B 3/46 379/29.03 |

FOREIGN PATENT DOCUMENTS

| | | |
|---|---|---|
| CN | 101871975 | 10/2010 |
| EP | 1 020 729 | 7/2000 |
| JP | 2002-43987 | 2/2002 |
| RU | 2451943 | 5/2012 |
| WO | 2005/104507 | 11/2005 |
| WO | 2008/134998 | 11/2008 |
| WO | 2010/053531 | 5/2010 |
| WO | 2013/079933 | 6/2013 |

OTHER PUBLICATIONS

Guangdong Science and Technology, No. 20, Oct. 31, 2008, Application of OWTSR Oscillatory Wave Test System in Cable State Diagnosis, pp. 158-159 (cited in Search Report in corresponding Chinese Application No. 201380065604.8 (document CA)).
International Search Report dated Jan. 16, 2014 in corresponding International Application No. PCT/NO2013/050182.
Norwegian Search Report dated May 24, 2013 in corresponding Norwegian Application No. 20121245.
Takayuki Yamada et al., "Improvement in Sensitivity of Broadband Impedance Spectroscopy for Locating Degradation in Cable Insulation by Ascending the Measurement Frequency", 2012 IEEE International Conference on Condition Monitoring and Diagnosis, Sep. 23-27, 2012, Bali, Indonesia, pp. 677-680.
Fabrice Auzanneau, "Wire Troubleshooting and Disagnosis: Review and Perspectives", Progress in Electromagnetics Research B, vol. 49, Feb. 22, 2013, pp. 253-279.
Extended European Search Report dated Jun. 17, 2016 in corresponding European Application No. 13849244.2.
Paolo F. Fantoni, "Condition Monitoring of Electrical Cables Using Line Resonance Analysis (LIRA)", Proceedings of the 17th International Conference on Nuclear Engineering, ICONE17, Jul. 16, 2009.

\* cited by examiner

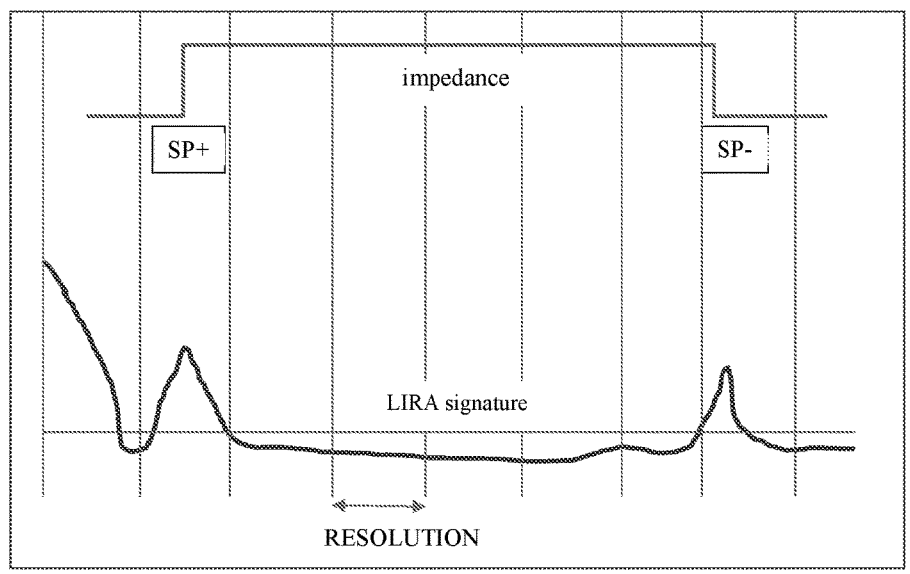
Figure 11 Segment with higher impedance, segment longer than LIRA resolution
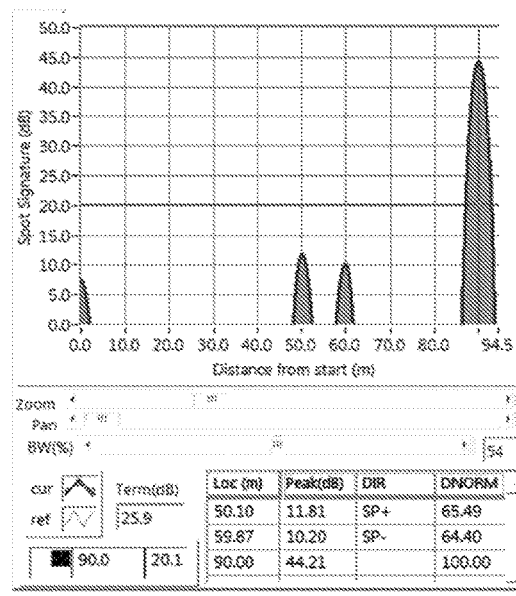
Figure 12 LIRA Signature for a 10m impedance step-up (-5 pF/m, resolution=1.5m)

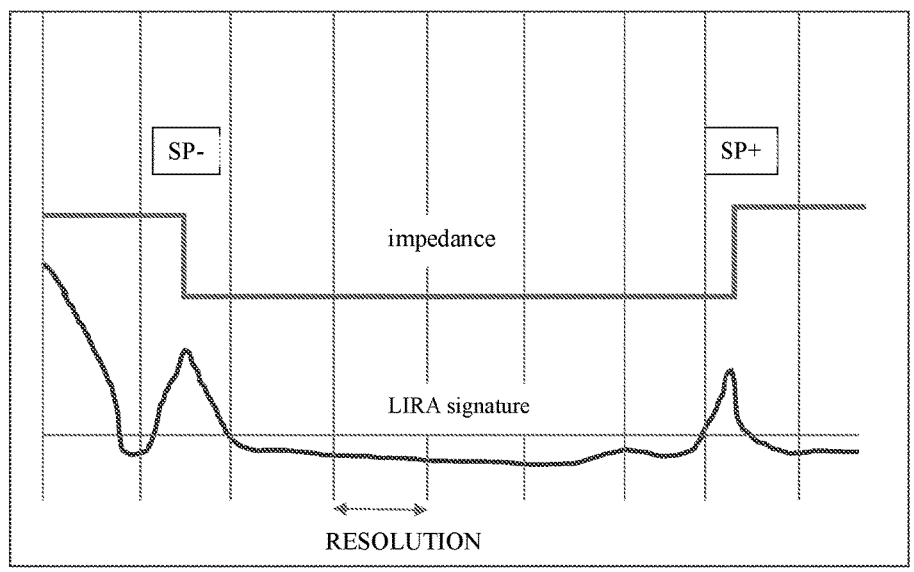
Figure 13 Segment with lower impedance, segment longer than LIRA resolution
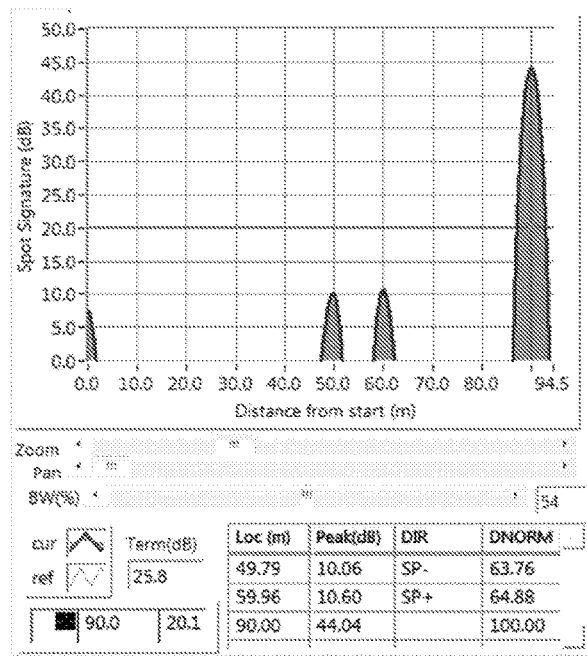
Figure 14 LIRA Signature for a 10m impedance step-down (+5 pF/m, resolution=1.5m)

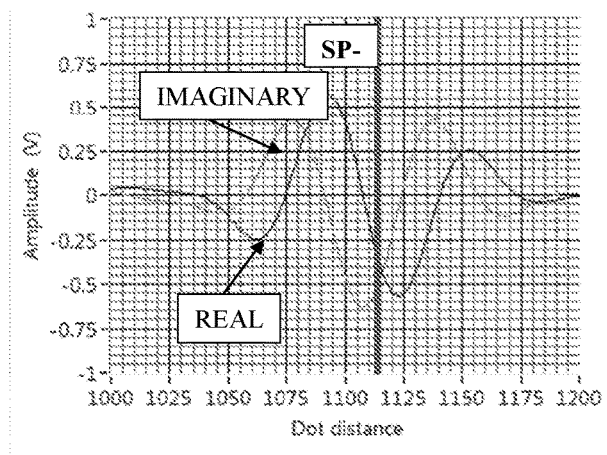
Figure 15 Single impedance step, negative (SP-). The spectrum at the step position is purely imaginary and negative
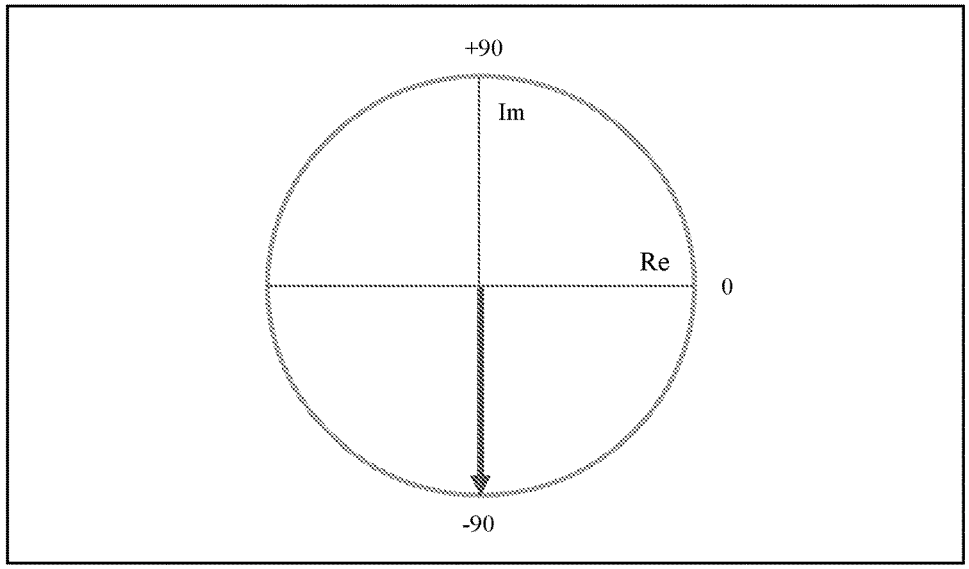
Figure 16 Complex value of the phase impedance spectrum at step location: pure imaginary and negative for SP-

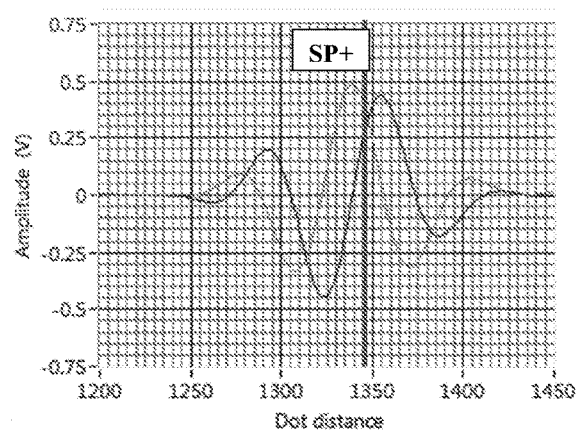
Figure 17 Single impedance step, positive (SP+). The spectrum at the step position is purely imaginary and positive
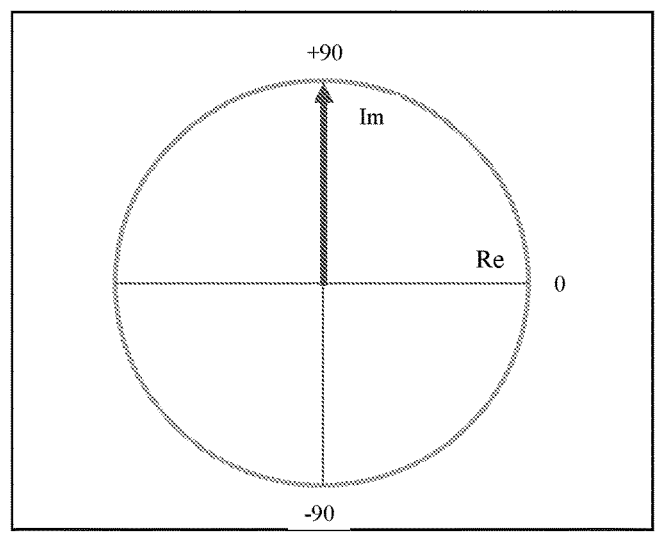
Figure 18 Complex value of the phase impedance spectrum at step location: pure imaginary and positive for SP+

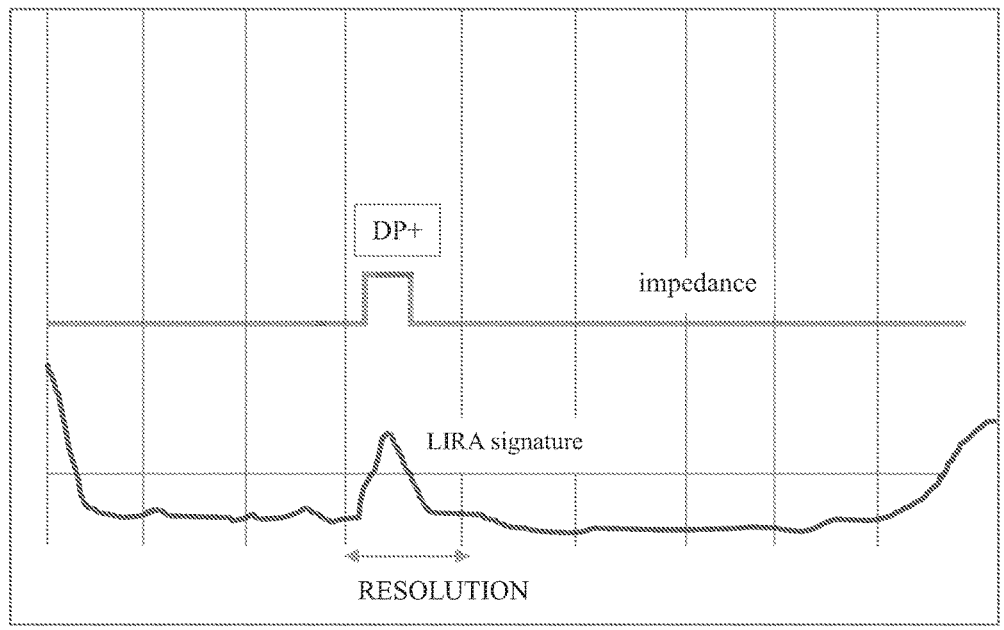
Figure 19 Segment with higher impedance, segment shorter than LIRA resolution
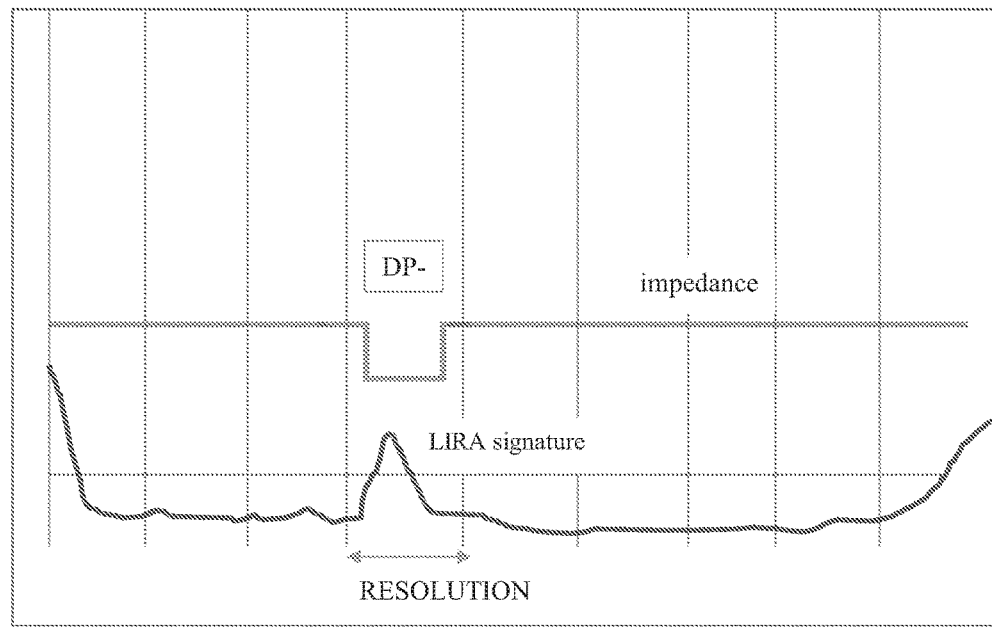
Figure 20 Segment with lower impedance, segment shorter than LIRA resolution

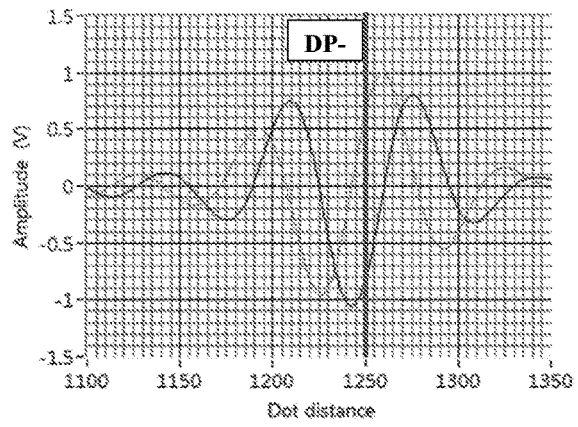
Figure 21 Low impedance spot, shorter than resolution (DP-). The spectrum at the spot is purely real and negative
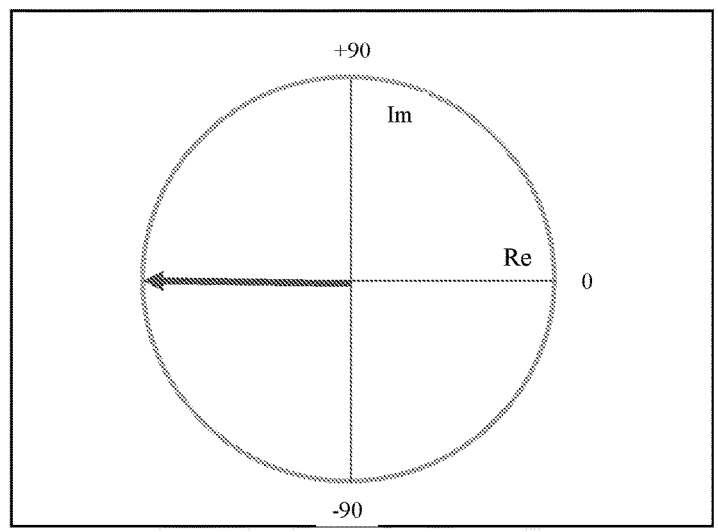
Figure 22 Complex value of the phase impedance spectrum at step location: pure real and negative for DP-

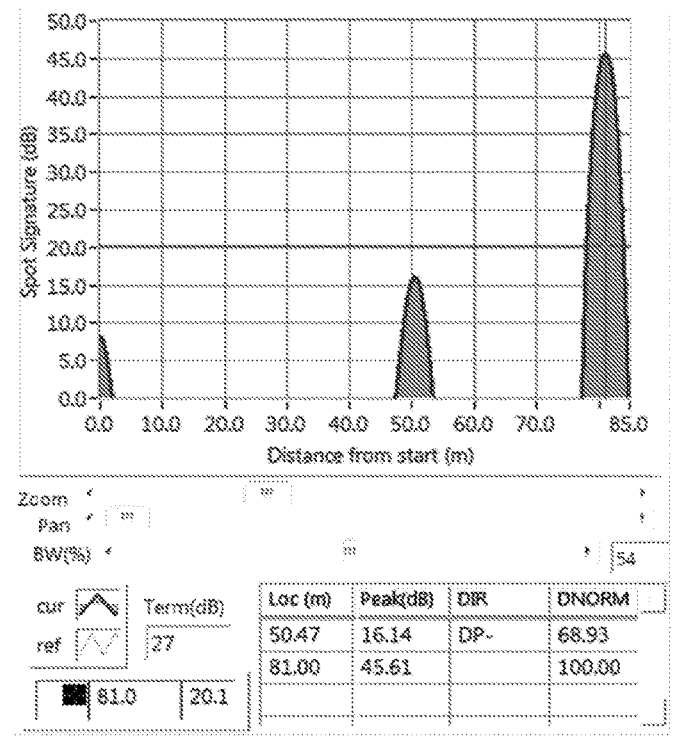
Figure 23 LIRA Signature for a DP- spot (+5 pF/m for 1m, resolution=1.5m)
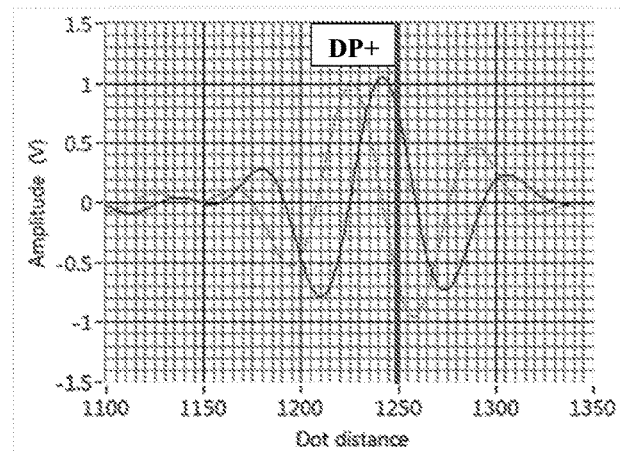
Figure 24 High impedance spot, shorter than resolution (DP+). The spectrum at the spot is purely real and positive

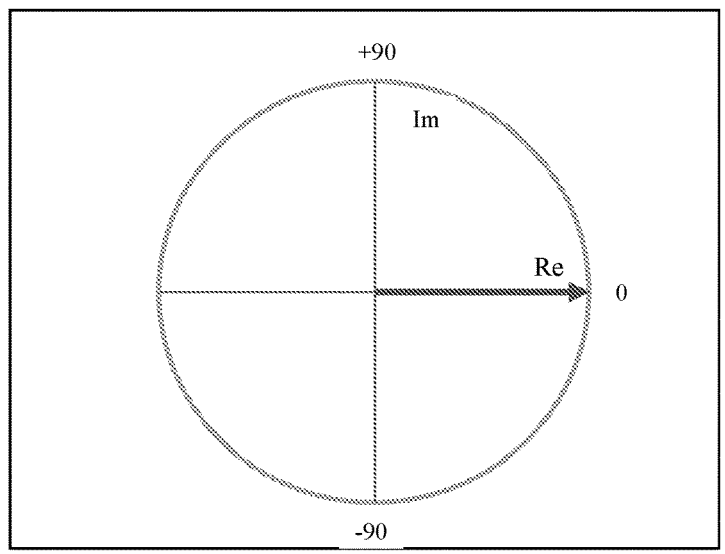
Figure 25 Complex value of the phase impedance spectrum at step location: pure real and positive for DP+
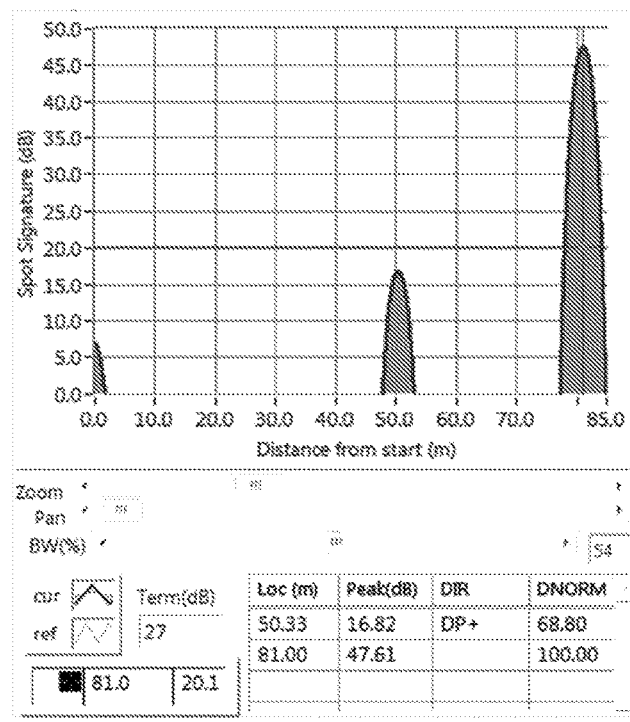
Figure 26 LIRA Signature for a DP+ spot (-5 pF/m for 1m, resolution=1.5m)

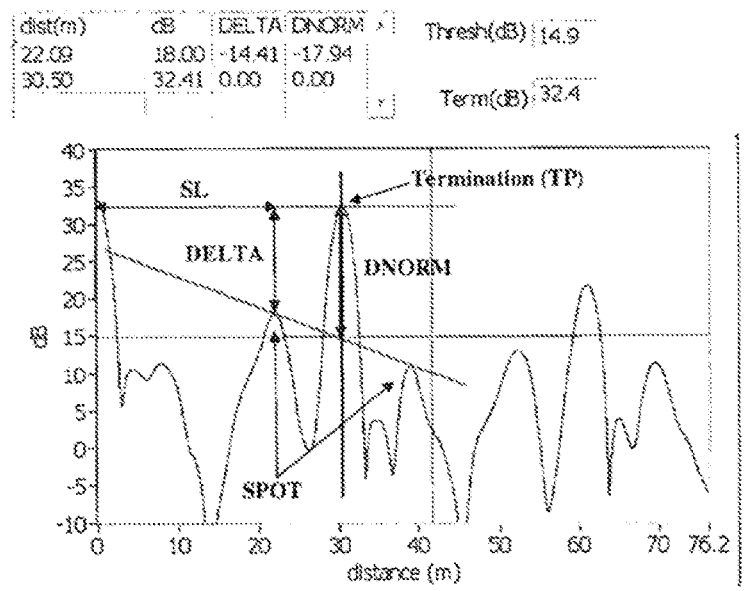
Figure 27
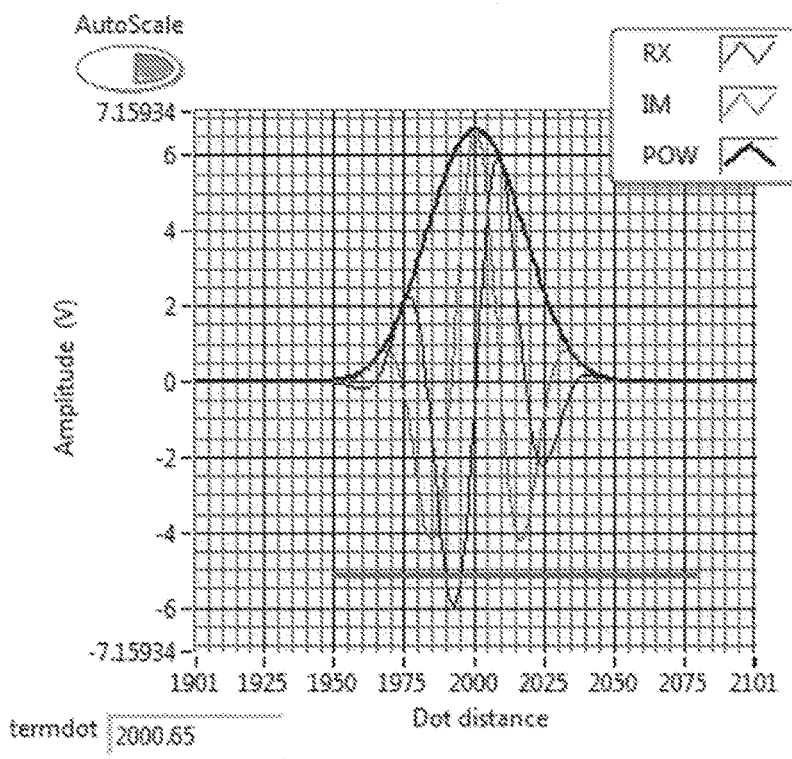
Figure 28 BTS in balancing conditions (good cable). BTS=0

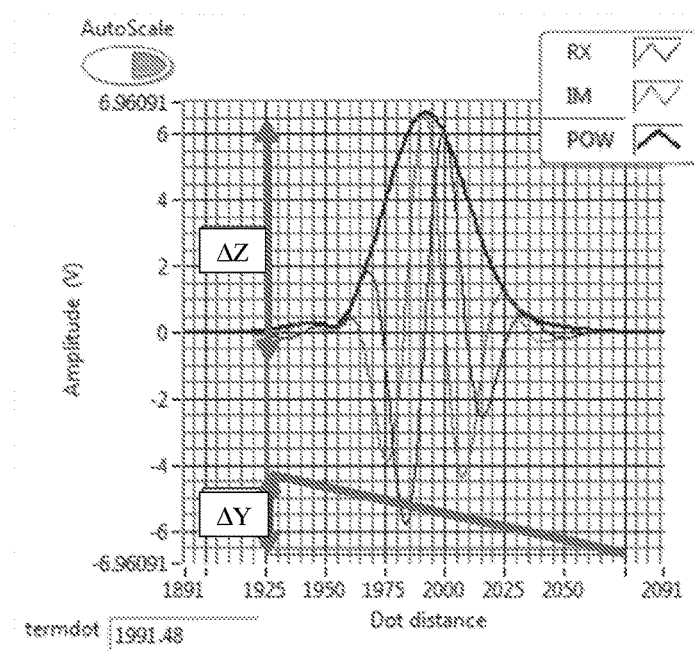
Figure 29 BTS with high capacitance (low impedance) termination. (BTS > 0)
BTS = ΔY/ΔZ*100
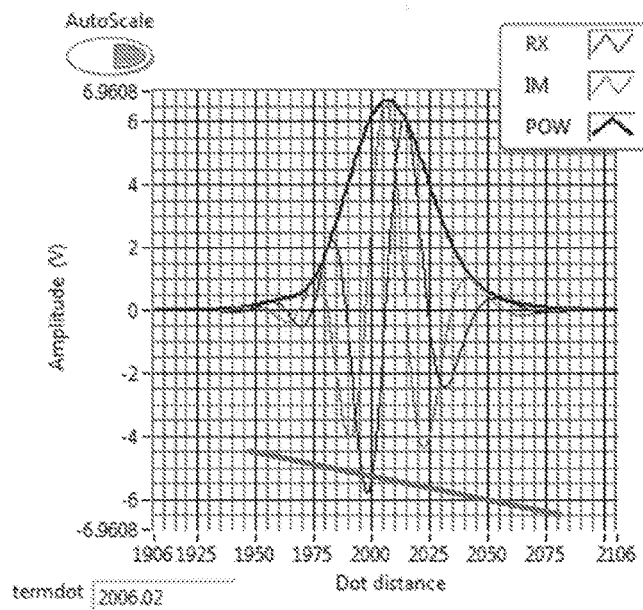
Figure 30 BTS with low capacitance (high impedance) termination. BTS <0

METHOD AND SYSTEM FOR MONITORING A CONDITION OF ELECTRICAL CABLES

INTRODUCTION

The present invention provides a system and a method for monitoring of installed electrical cables based on line resonance analysis. Monitoring comprises e.g. condition monitoring and real-time diagnosis of the electric cables. Throughout the present description the system is also referred to as LIRA (Line Resonance Analysis System). The cables have lengths ranging from a few meters to several hundred kilometers, depending on the cable structure and attenuation.

BACKGROUND

LIRA (Line Resonance Analysis System) is based on transmission line theory, an established and well documented theory that is at the base of two other existing cable fail detection techniques known as "Time Domain Reflectometry" (TDR) and "Frequency Domain Reflectometry" (FDR).

A transmission line is the part of an electrical circuit providing a link between a generator and a load. The behavior of a transmission line depends by its length in comparison with the wavelength $\lambda$ of the electrical signal traveling into it. The wavelength is defined as:

$$\lambda = v/f \qquad (1)$$

where v is the speed of the electric signal in the wire (also called the phase velocity) and f the frequency of the signal.

When the transmission line length is much lower than the wavelength, as it happens when the cable is short (i.e. few meters) and the signal frequency is low (i.e. few KHz), the line has no influence on the circuit behavior. Then the circuit impedance ($Z_{in}$), as seen from the generator side, is equal to the load impedance at any time.

However, if the line length is higher than the signal wavelength, ($L \geq \lambda$), the line characteristics take an important role and the circuit impedance seen from the generator does not match the load, except for some very particular cases.

The voltage V and the current I along the cable are governed by the following differential equations, known as the telephonists equations:

$$\frac{d^2 V}{dz^2} = (R + j\omega L)(G + j\omega C)V \qquad (2)$$

$$\frac{d^2 I}{dz^2} = (R + j\omega L)(G + j\omega C)I \qquad (3)$$

where $\omega$ is the signal radial frequency, R is the conductor resistance, L is the inductance, C the capacitance and G the insulation conductivity, all relative to a unit of cable length.

These four parameters completely characterize the behavior of a cable when a high frequency signal is passing through it. In transmission line theory, the line behavior is normally studied as a function of two complex parameters. The first is the propagation function $$\gamma = \sqrt{(R+j\omega L)(G+j\omega C)} \qquad (4)$$

often written as $$\gamma = \alpha + j\beta \qquad (5)$$

where the real part $\alpha$ is the line attenuation constant and the imaginary part $\beta$ is the propagation constant, which is also related to the phase velocity v, radial frequency $\omega$ and wavelength $\lambda$ through:

$$\beta = \frac{2\pi f}{\lambda} = \frac{\omega}{v} \qquad (6)$$

The second parameter is the characteristic impedance $$Z_0 = \sqrt{\frac{R + j\omega L}{G + j\omega C}} \qquad (7)$$

Using (4) and (7) and solving the differential equations (2) and (3), the line impedance for a cable at distance d from the end is:

$$Z_d = \frac{V(d)}{I(d)} = Z_0 \frac{1 + \Gamma_d}{1 - \Gamma_d} \qquad (8)$$

Where $\Gamma_d$ is the Generalized Reflection Coefficient $$\Gamma_d = \Gamma_L e^{-2\gamma d} \qquad (9)$$

and $\Gamma_L$ is the Load Reflection Coefficient $$\Gamma_L = \frac{Z_L - Z_0}{Z_L + Z_0} \qquad (10)$$

In (10) $Z_L$ is the impedance of the load connected at the cable end.

From eqs. (8), (9) and (10), it is easy to see that when the load matches the characteristic impedance, $\Gamma_L = \Gamma_d = 0$ and then $Z_d = Z_0 = Z_L$ for any length and frequency. In all the other cases, the line impedance is a complex variable governed by eq. (8), which has the shape of the curves in FIG. 1 (amplitude and phase as a function of frequency).

Existing methods based on transmission line theory try to localize local cable failures (no global degradation assessment is possible) by a measure of V (equation (2)) as a function of time and evaluating the time delay from the incident wave to the reflected wave. Examples of such methods are found in U.S. Pat. Nos. 4,307,267 and 4,630,228, and in US publications 2004/0039976 and 2005/0057259.

A method and a system for monitoring a condition of an electrical cable by analyzing a multifrequency signal applied to the cable is disclosed in U.S. Pat. No. 7,966,137B2. This disclosed method and system detect impedance changes along the cable. The monitoring system and method disclosed in U.S. Pat. No. 7,966,137B2 is referred to as a LIRA technique (Line Resonance Analysis System). The LIRA technique provides transformation into the domain of the line impedance (both amplitude and phase), also called the domain of t', and applies frequency analysis in this domain. The steps involved in this process are:
 1. Send an extended bandwidth signal through the cable and measure the reflected signal
 2. Estimate the line impedance through the entire bandwidth on the basis of the sent and reflected signals 3. Analyse the line impedance to get information about cable properties, global cable condition, local degradation spots.

LIRA (Line Resonance Analysis System) improves the detection sensitivity and accuracy by analyzing the cable input impedance (see equation (8) and FIG. 1). Local degradation detection and localization, as well as global degradation assessment is provided by:

Noiseless estimation of the line input impedance as a function of frequency (bandwidth 0-X MHz, where X depends on the cable length), and spectrum analysis of the line input impedance to detect and localize degradation spots (see detailed explanation). These steps are explained in detail later.

The LIRA method provides the possibility to detect degradations at an early stage, especially for cables longer than a few kilometers. In this case, LIRA can estimate the location of the challenged part with an estimation error within 0.3% of the cable length.

In addition, a global cable condition assessment is possible, which is important for cable residual life estimation in harsh environment applications (for example nuclear and aerospace applications).

The method described in U.S. Pat. No. 7,966,137B2 has however limitations as to the sensitivity at the cable termination and within areas of the cable where impedance changes have been identified and also with regard to the severity of the cable degradation.

SUMMARY OF THE INVENTION

The object of the invention is to solve or at least alleviate the problems indicated above.

In an aspect the invention provides a method for monitoring a condition of an electrical cable, said method comprising:

applying a broadband signal wave having a frequency f to a first end of the electrical cable the electrical cable, wherein the broadband signal wave is phase and amplitude modulated by at least a cable impedance of the electrical cable, acquiring at the first end of the cable the phase and amplitude modulated broadband signal wave transmitted and reflected by the electrical cable, calculating a complex cable impedance $Z_{DUT}$ as a function of the frequency f specified by an amplitude and a phase, for the acquired reflected broadband signal wave, translating the calculated complex cable impedance into a time domain t';

calculating a frequency f' in the time domain t', wherein the frequency f' is the fundamental frequency of a pseudo-periodic function of radial frequency w' and amplitude A in the time domain t' due to wave reflection of the broadband signal wave at a distance d from an end of the cable, and wherein the frequency f' is calculated by applying:

$$f' = \frac{\omega'}{2\pi} = \frac{2d}{v_r v_0}$$

in which $v_0$ is the speed of light in a vacuum and $v_r$, is an estimated relative phase velocity of an electrical signal in the cable;

performing a power spectrum analysis of both amplitude and phase of the complex cable impedance in the time domain t' to find and localize any local degradation to the insulation of the cable;

identifying frequency components $f''_1, f''_2, \ldots, f''_n$ in the power spectrum of the time domain t' due to wave reflections of the broadband signal wave at locations $x_1, x_2, \ldots, x_n$ along the cable, the wave reflections being due to discontinuities in electrical parameters of the cable; and calculating each of the locations Xi by applying:

$$x_i = \frac{v_r v_0 f''_i}{2}$$

establishing a relationship between a real and an imaginary part of a phase impedance spectrum Fourier transform of the power spectrum in an interval around at least one of the locations $x_1, x_2, \ldots, x_n$ along the cable, and identifying impedance changes in at least one of the locations $x_1, x_2, \ldots, x_n$ along the cable from said real and imaginary part.

In an embodiment identifying impedance changes includes identifying at least one of a step up impedance change, a step down impedance change, a high impedance spot or a low impedance spot. A high impedance spot is identified when the Imaginary part is zero and the real part is positive. A low impedance spot is identified when the Imaginary part is zero and the real part is negative. A step up impedance change is identified when the real part is zero and the imaginary part is positive. A step down impedance change is identified when the real part is zero and the imaginary part is negative.

In an embodiment the method may further comprise identifying a cable segment with a lower impedance as a step-down impedance change in the beginning of the cable segment followed by a step-up impedance change at the end of the cable segment. Further, the method may comprise identifying a cable segment with a higher impedance as a step-up impedance change in the beginning of the cable segment followed by a step-down impedance change at the end of the cable segment.

In a further aspect the invention provides a method for monitoring a condition of an electrical cable, said method comprising:

applying a broadband signal wave having a frequency f to a first end of the electrical cable, wherein the broadband signal wave is phase and amplitude modulated by at least a cable impedance of the electrical cable, acquiring at the first end of the cable the phase and amplitude modulated broadband signal wave transmitted and reflected by the electrical cable, estimating/calculating a complex cable impedance $Z_{DUT}$ as a function of the frequency f specified by an amplitude and a phase, for the acquired reflected broadband signal wave, translating the calculated complex cable impedance into a time domain t';

calculating a frequency f' in the time domain t', wherein the frequency f' is the fundamental frequency of a pseudo-periodic function of radial frequency w' and amplitude A in the time domain t' due to wave reflection of the broadband signal wave at a distance d from an end of the cable, and wherein the frequency f' is calculated by applying:

$$f' = \frac{\omega'}{2\pi} = \frac{2d}{v_r v_0}$$

in which $v_0$ is the speed of light in a vacuum and $v_r$, is an estimated relative phase velocity of an electrical signal in the cable;
  performing a power spectrum analysis of both amplitude and phase of the complex cable impedance in the time domain t' to find and localize any local degradation to the insulation of the cable;
  identifying frequency components $f''_1, f''_2, \ldots f''_n$, in the power spectrum of the time domain t' due to wave reflections of the broadband signal wave at locations $x_1, x_2, \ldots, x_n$ along the cable, the wave reflections being due to discontinuities in electrical parameters of the cable; and
calculating each of the locations Xi by applying:

$$x_i = \frac{v_r v_0 f''_i}{2}$$

further comprising establishing a local degradation severity of an identified fault in the cable insulation in at least one of the locations $x_1, x_2, \ldots, x_n$ along the cable by analyzing a second order reflection of the broadband signal in said identified fault location.

In an embodiment, the method may comprise establishing a difference between a height of a first order reflection peak and the height of the second order reflection peak in the power spectrum and to evaluate the cable attenuation in order to normalize the height of any peak at any distance from the termination.

Further, the methods in accordance with the aspects above may further comprise establishing a measure of the condition of the cable end by analyzing a termination peak in the power spectrum, comprising establishing a relationship between the difference dy between the two valleys on each side of the termination peak and a height dz of the termination peak.

In an embodiment the method comprises further, estimating, using the analyzer, the estimated relative phase velocity $v_r$, wherein the estimating the estimated relative phase velocity Vr includes:
  evaluating at least two resonance frequencies of the complex cable impedance ZDUT;
  identifying two consecutive resonance frequency values $f_k$ and $f_{k+}$ respectively, of the complex cable impedance ZDUT;
  calculating a first value of a relative phase velocity Vr of the cable by applying
    $v_r=2L(f_{k+1}-f_k)/v_0$,
where L is the length of the cable;
  calculating the fundamental frequency f' of the cable, in the time domain t' using the first relative phase velocity Vr and applying $$f' = \frac{2L}{v_r v_0};$$

calculating a second value f" of the fundamental frequency f' by finding a maximum peak value in the time domain t' in a selectable interval around f'; and
calculating the estimate of the relative phase velocity $v^{final}_r$ applying $$v^{final}_r = \frac{2L}{v_0 f''}$$

In a further aspect the invention provides a system for monitoring a condition of an electrical cable, said system comprising:
  an analyzer for calculating a complex cable impedance ZDUT as a function of a frequency f specified by an amplitude and phase;
  a generating means for generating a broadband signal wave that is to be phase and amplitude modulated by a cable impedance, the broadband signal wave being applied to a first end of the cable, wherein the frequency f is a frequency of the broadband signal wave;
  an acquisition module for acquiring at the first cable end the broadband signal wave phase and amplitude modulated by the cable impedance;
  a translating means for translating the complex cable impedance ZDUT into a time domain t',
  an analyzer for calculating a frequency f' in the time domain t, wherein the frequency f' is the fundamental frequency of a pseudo-periodic function of radial frequency ω' and amplitude A in the time domain t' due to wave reflection of the broadband signal wave at a distance d from an end of the cable, and wherein the frequency f' is calculated by applying:

$$f' = \frac{\omega'}{2\pi} = \frac{2d}{v_r v_0}$$

in which Vo is the speed of light in a vacuum and Vr is an estimated relative phase velocity of an electrical signal in the cable,
wherein said analyzer performs a power spectrum analysis of both amplitude and phase of the complex cable impedance in the time domain t' to find and localize any local degradation to insulation of the cable,
wherein said analyzer identifies frequency components $f''_1, f''_2, \ldots f''_n$ in the power spectrum of the time domain t' due to wave reflections at locations $x_1, x_2, \ldots, x_n$ along the cable, the wave reflections being due to discontinuities in electrical parameters of the cable, and
wherein said analyzer calculates each of the locations Xi by applying:

$$x_i = \frac{v_r v_0 f''_i}{2}$$

wherein said analyzer further establishes a relationship between a real and an imaginary part of a phase impedance spectrum Fourier transform of the power spectrum in an interval around at least one of the locations $x_1, x_2, \ldots, x_n$ along the cable, and
  identifying impedance changes in the locations $x_1, x_2, \ldots, x_n$ along the cable from said real and imaginary part.

Identifying impedance changes may include identifying at least one of a step up impedance change, a step down impedance change, a high impedance spot or a low impedance spot. A high impedance spot is identified when the Imaginary part is zero and the real part is positive. A low impedance spot is identified when the Imaginary part is zero and the real part is negative. A step up impedance change is identified when the real part is zero and the imaginary part is positive. A step down impedance change is identified when the real part is zero and the imaginary part is negative.

In an embodiment the system may further comprise identifying a cable segment with a lower impedance as a step-down impedance change in the beginning of the cable segment followed by a step-up impedance change at the end of the cable segment. The system may further comprise identifying a cable segment with a higher impedance as a step-up impedance change in the beginning of the cable segment followed by a step-down impedance change at the end of the cable segment.

Further, establishing a local degradation severity of an identified fault in the cable insulation in at least one of the locations $x_1, x_2, \ldots x_n$ along the cable may be performed by analyzing a second order reflection of the broadband signal in said identified fault location. The system may further comprise establishing a difference between a height of a first order reflection peak and the height of the second order reflection peak in the power spectrum and normalizing the height difference to a height of a termination peak in the power spectrum. Establishing a measure of the condition of the cable end may be performed by the system by analyzing a termination peak in the power spectrum, comprising establishing a relationship between the difference dy between the two valleys on each side of the termination peak and a height dz of the termination peak.

In a further embodiment of the system, the analyzer is operable to:
evaluate at least two resonance frequencies of the complex cable impedance $Z_{DUT}$;
identify two consecutive resonance frequency values $f_k$ and $f_{k+1}$ respectively, of the complex cable impedance $Z_{DUT}$;
calculate a first value of a relative phase velocity $v_r$ of the cable by applying $$v_r = 2L(f_{k+1} - f_k)/v_0,$$

where L is the length of the cable;
calculate the fundamental frequency f' of the cable using the first relative phase velocity $v_r$ and applying $$f' = \frac{2L}{v_r v_0},$$

calculate a second value f" of the fundamental frequency f' by finding a maximum peak value in the time domain t' in a selectable interval around f"; and
calculate the estimate of the relative phase velocity $v_r^{final}$ by applying $$v_r^{final} = \frac{2L}{v_0 f''}$$

The invention provides a system of condition monitoring of an electrical cable, the system comprising a generating means providing a reference signal CH0; an acquisition means acquiring said reference signal CH0 and a signal CH1, said signal CH1 being the reference signal CH0 after amplitude and phase modulation by a cable impedance $Z_{DUT}$ of the electrical cable; and an analyzing means calculating the complex cable impedance $Z_{DUT}$ as a function of the applied signal frequency based on the reference signal CH0 and the signal CH1, and analyzing said cable impedance providing an assessment of cable condition and/or cable failure.

Said generating means may be operative to provide a reference signal CH0 selected from a group consisting of a sweep signal having a frequency bandwidth from $w_1$ to $w_2$ (both selectable).

The acquisition means may be a digital storage oscilloscope.

LIRA (Line Resonance Analysis System) is able to monitor the global, progressive degradation of the cable insulation due to harsh environment conditions (e.g. high temperature, humidity, radiation) and detect local degradation of the insulation material due to mechanical effects or local abnormal environment conditions.

The LIRA system may be used for detecting and monitoring insulation degradation and line breakage in all kinds of electrical cables (power and signal cables); i.e. cables in power generation, distribution and transmission, cables in process industries, cables in aerospace industry, on cable in onshore, offshore and subsea installations, and identify the position of the damage/breakage. The monitoring and detection may be performed from a remote location in real time.

The improved LIRA system according to the present invention provides improvements regarding the two following aspects:
1. Severity assessment of the localized feature and better understanding of the behavior of electrical parameters at the damage position; i.e. if the impedance is increasing or decreasing. Assessing whether the impedance is increasing or decreasing. This helps in assessing the cause of the damage. For example, water or moisture penetration always results in a decrease of the impedance.
2. Cable condition at the termination, which will be explained in detail later.

The improved LIRA system according to the present invention enables monitoring of the conditions at the cable termination. Establishing the condition of the cable end is particularly important in environments as e.g. oil and gas industry, downhole in oil wells, subsea, nuclear power plants, power transmission distribution and other hard to reach locations.

The invention is defined in the appended claims.

BRIEF DESCRIPTION OF DRAWINGS

Embodiments of the invention will now be described with reference to the following drawings, where:

FIG. 11 illustrates the LIRA Signature from a segment of a cable with a higher impedance, and where this segment is longer than the resolution of the LIRA according to an embodiment of the present invention;

FIG. 12 shows a display image of a LIRA Signature for an impedance step-up (−5 pF/m, resolution=1.5 m) as illustrated in FIG. 11 from 50 m to 60 m from cable start according to an embodiment of the present invention;

FIG. 13 illustrates the LIRA Signature from a segment of a cable with lower impedance, where the segment is longer than the LIRA resolution according to an embodiment of the present invention;

FIG. 14 shows a display image of a LIRA Signature for an impedance step-down (+5 pF/m, resolution=1.5 m) as illustrated in FIG. 13 from 50 m to 60 m from cable start according to an embodiment of the present invention;

FIG. 15 is a display image of the amplitude in Volt of a cable impedance (real and imaginary parts) spectrum at the step position as a function of dot distance for a single impedance step, negative (SP−), and where the spectrum at the impedance step position is purely imaginary and negative according to an embodiment of the present invention;

FIG. 16 shows the complex value of the phase impedance spectrum at the step location shown in FIG. 15, where the complex value is pure imaginary and negative for SP− according to an embodiment of the present invention;

FIG. 17 is a display image of the amplitude in Volt of a cable impedance (real and imaginary parts) spectrum at the step position as a function of dot distance for a single impedance step, positive (SP+) and where the spectrum at the impedance step position is purely imaginary and positive according to an embodiment of the present invention;

FIG. 18 shows the complex value of the phase impedance spectrum at the impedance step location shown in FIG. 17, where the complex value is pure imaginary and positive for SP+ according to an embodiment of the present invention;

FIG. 19 illustrates a segment of a cable with a higher impedance and the corresponding LIRA Signature shown below, and where this cable segment is shorter than the LIRA resolution according to an embodiment of the present invention;

FIG. 20 illustrates a segment of a cable with a lower impedance and the corresponding LIRA Signature shown below, and where this cable segment is shorter than LIRA resolution according to an embodiment of the present invention;

FIG. 21 is a display image of the amplitude in Volt of a cable impedance (real and imaginary parts) spectrum at the step position as a function of dot distance (m) for a low impedance spot, as shown in FIG. 20, where the impedance spot is shorter than the resolution of the LIRA (DP−); the spectrum at the spot is purely real and negative according to an embodiment of the present invention;

FIG. 22 shows the complex value of the phase impedance spectrum at the impedance step location from FIGS. 20 and 21: where the complex value is pure real and negative for DP− according to an embodiment of the present invention;

FIG. 23 is a display image of a LIRA Signature for a DP− spot (+5 pF/m for 1 m, resolution=1.5 m) as shown in FIG. 20-22 at a position of 50 m from the start of the cable according to an embodiment of the present invention;

FIG. 24 is a spectrum (real and imaginary parts) of a high impedance spot of the cable as shown in FIG. 25, where the length of the impedance spot is shorter than the resolution of the LIRA (DP+), and where the spectrum at the spot is purely real and positive according to an embodiment of the present invention;

FIG. 25 shows the complex value of the phase impedance spectrum from FIG. 24 at the impedance step location; where the complex value is pure real and positive for DP+ according to an embodiment of the present invention;

FIG. 26 shows the LIRA Signature for a DP+ spot (−5 pF/m for 1 m, resolution=1.5 m) as shown in FIGS. 19, 24, 25 at a distance of 50 m from start of the cable according to an embodiment of the present invention;

FIG. 27 shows a display image in which it is shown how a local degradation severity is correlated to the spike heights of the LIRA signature according to an embodiment of the present invention;

FIG. 28 shows a display image of a Balanced termination Signature (BTS) at a cable end for a cable in balancing conditions (good cable) BTS=0, according to an embodiment of the present invention;

FIG. 29 shows a display image of a Balanced termination Signature (BTS) at a cable end for a cable with a high capacitance (low impedance) termination, where (BTS>0), where BTS=$\Delta Y/\Delta Z*100$, according to an embodiment of the present invention; and FIG. 30 shows a display image of a Balanced termination Signature (BTS) at a cable end for a cable with a low capacitance (high impedance) termination, where BTS<0, according to an embodiment of the present invention.

DETAILED DESCRIPTION

Figure 1:
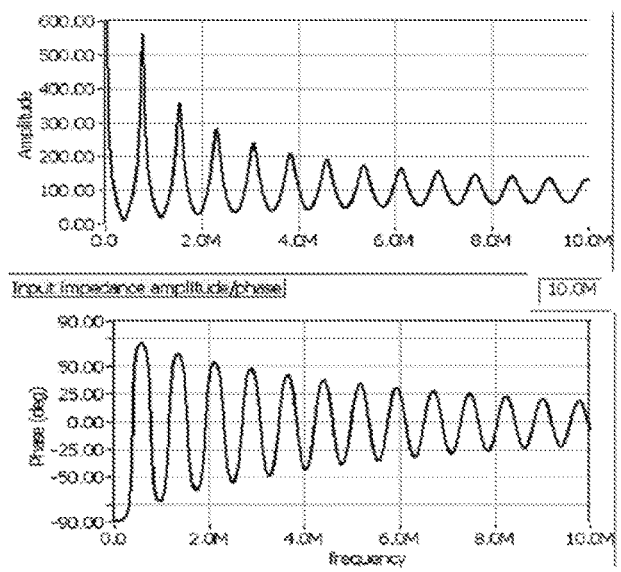
FIG. 1 shows a graphical representation of a complex line impedance amplitude and phase as a function of frequency according to equation (8)
Figure 2:
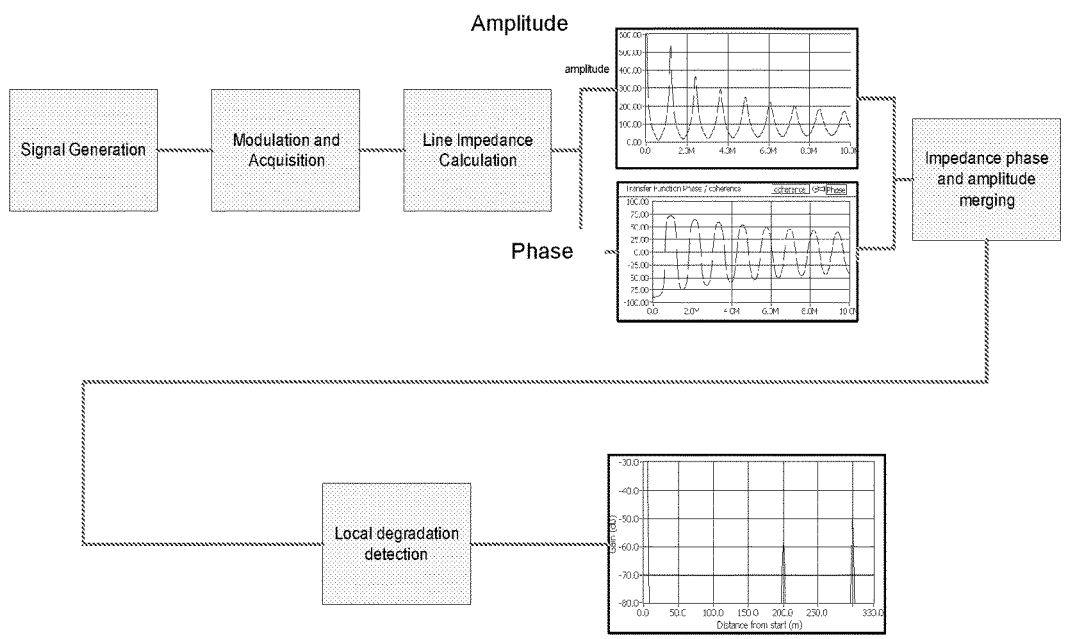
FIG. 2 shows a functional diagram of a spot detection algorithm.

Throughout the description and in the claims the term monitor is to be widely interpreted and includes e.g. global/local condition monitoring, real-time diagnosis, and fault detection.

The monitoring and analyzing system according to the invention may be implemented as software modules. The monitoring system may be implemented in a portable hardware system. The hardware comprises an input module for connection to the cable/wire to be monitored. The monitoring and analyzing software may perform the method and provide the analyzing result for the cable/wire automatically. Manual intervention by an operator of the monitoring and analyzer system is however also possible.

The LIRA simulator module. LIRA simulator works in frequency domain applying the transmission line equations (Eqs. 1 to 10). In addition to that, it employs a stochastic model to evaluate the uncertainties in the cable electrical parameters due to manufacturing tolerances and environment changes. Cable parameters and load parameters for the actual cable connection are input to the LIRA simulator module.

The stochastic model evaluates and applies statistical variations (using a normal distribution with user selected standard deviation) in the electrical parameters (L, C and R) along the cable, due to manufacturing tolerances and environment noise.

The LIRA Analyzer module. It can be operated in real or simulation mode. In the first case it takes the input from the acquisition board signal acquiring module, in the second case the input comes from the LIRA simulator module. The LIRA Analyzer is the core of the wire/cable monitoring system.

The LIRA Analyzer works both in frequency and time domain, performing the following tasks:

Estimate and display the frequency spectrum of the line input impedance.

Calculate the resonance frequencies. Resonance frequencies are calculated from the impedance spectrum and correspond to frequency values where the phase is zero.

Estimate the cable characteristic impedance $Z_{DUT}$. It is also calculated from the impedance spectrum. The characteristic impedance is the value of the impedance amplitude at any local maximum (or minimum) of the impedance phase.

Estimate the cable length, if not known.

Detect local degradation areas and localize it.

Detect load changes.

Analyzing and displaying the frequency spectrum in order to identify impedance changes and impedance spots, calculating real and imaginary components of the impedance phase spectrum and analyzing spike heights.

Diagnosis and Localisation of Local Degradation

The line impedance is calculated as the averaged windowed transfer function from the reference signal CH0 to the impedance modulated signal CH1, which result in the calculation of the amplitude and phase of the line impedance $Z_{DUT}$ as a function of frequency (See Eq. (11)). Once the line impedance is calculated, the cable state is analyzed by the examination of the frequency content of the amplitude and phase components of the complex impedance. This will be explained in the following. Zdut may be calculated in hardware, and in this case we do not see CH0 and CH1.

Eq. (8) is the mathematical expression of the function in FIG. 1. Actually the line impedance $Z_d$ (for a cable at distance d from the end of the cable), is a complex parameter and FIG. 1 shows both the amplitude and phase of it. The pseudo-periodic shape of the phase is due to the periodicity of $\Gamma_d$, Eq. (9), that can be rewritten as:

$$\Gamma_d = \Gamma_L e^{-2\alpha d} e^{-2j\beta d} \quad (12)$$

where the amplitude is decreasing with d (the cable length) because of the attenuation $\alpha$ (the phase is periodic if $\alpha=0$). The period of $\Gamma d$ (and then of the line impedance phase) is $\frac{1}{2}\beta$, considering d as the independent variable, or $\frac{1}{2}d$, considering $\beta$ the independent variable (as in FIG. 1).

Using the expression for the propagation constant $\beta$ from Eq. (6), Eq. (12) can be rewritten as:

$$\Gamma_d = \Gamma_L e^{-2\alpha d} e^{\frac{-2j\omega d}{v}} \quad (13)$$

$$\Gamma_d = \Gamma_L e^{-2\alpha d} e^{\frac{-4j\pi f d}{v}} \quad (14)$$

where f is the frequency of the applied signal that travels along a cable of length d and v is the phase velocity of the electrical signal in the cable.

Assuming f as the independent variable and writing the following translations:

$$f \to t' \quad (15)$$

$$\frac{4\pi d}{v_r v_0} \to \omega' \quad (16)$$

where $v_r = v/v_0$, $v_r$ being the relative phase velocity of the electrical signal in the cable, and $v_0$ the speed of light in vacuum.

$$\Gamma_L e^{-2\alpha d} = A \quad (17)$$

Eq. (14) becomes:

$$\Gamma_d = A e^{-j\omega' t'} \quad (18)$$

Figure 3:
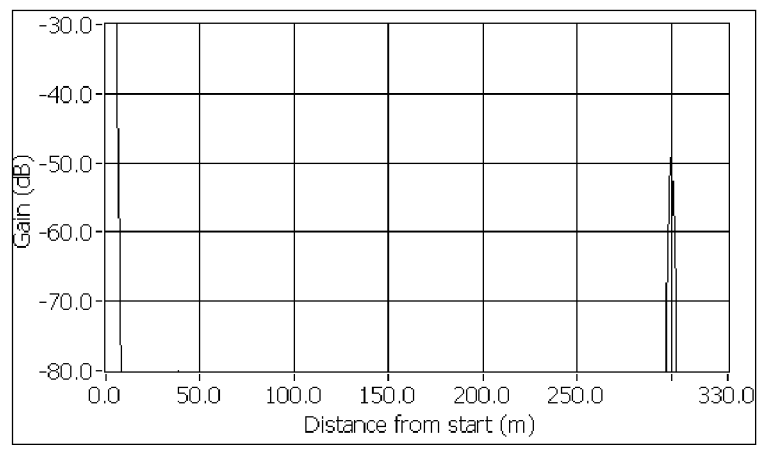
FIG. 3 is a power spectrum of a phase impedance in a domain of t', where the x-axis has been scaled to distance from cable start (d=300 m)

Equation (18) is the mathematical expression (in complex notation) of a pseudo-periodic function of radial frequency $\omega'$ and amplitude A. In the lossless case ($\alpha=0$) A=1, in real life lossy cables $\alpha$ is an increasing function of signal frequency, so that amplitude A is a decreasing function of t', resulting in the damped oscillation of FIG. 1. The frequency of this function (in the domain of t') is:

$$f' = \frac{\omega'}{2\pi} = \frac{2d}{v_r v_0} \quad (19)$$

where f' is the fundamental frequency of the phase function in the domain of t' due to the wave reflection at distance d (the cable termination). Note that the expression of f' has the dimension of time and it is the time elapsed for a wave to reach the termination at the distance d and be reflected back. The Fourier transform (power spectrum) of the impedance phase, in the domain of t', looks e.g. like FIG. 3, where the x-axis has been scaled to d at the fundamental frequency given in Eq. (19). In FIG. 3, the x-axis has been scaled to distance from cable start (d=300 m).

When at a distance x the wave finds a discontinuity in the electrical parameters of the cable (for example a small change in the insulation dielectric), another reflection would be visible from distance x, which would add a new frequency component in the power spectrum of the impedance phase, where the frequency (from Eq. (19)) would be:

$$f'' = \frac{2x}{v_r v_0} \quad (20)$$

And so:

$$\frac{f'}{f''} = \frac{d}{x} \quad (21)$$

If the cable length is known, the knowledge of f' and f'' from the power spectrum of the impedance phase (in the domain of t') is sufficient for the calculation of the x location:

$$x = d \frac{f''}{f'} \quad (22)$$

If d is not known, the knowledge of the relative phase velocity $v_r$ (from the cable datasheet or by measuring it on a cable sample of the same type) can be used to calculate the x location based on Eq. (19):

$$x = \frac{v_r v_0 f''}{2} \quad (23)$$

Figure 4:
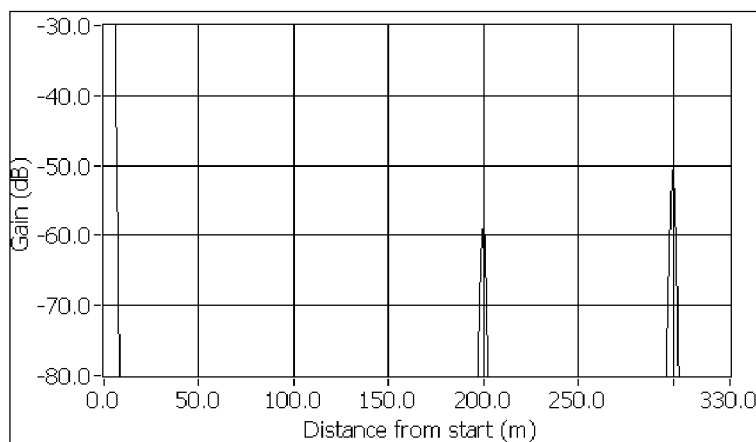
FIG. 4 is a power spectrum of phase impedance in the domain of t', where the frequency component at x=200 is visible, due to a capacity change of 20 pF in a 30 cm cable segment.

The final result is then a spike at any position where a change (even a very small change) of electrical parameters (mainly a dielectric value change) produces a reflected wave of the applied reference signal. This reflection appears as a frequency component in the phase/amplitude spectrum of the line impedance. The frequency of the reflected wave is a linear function of the distance from the cable end to the deviation. FIG. 4 shows a Fourier transform (power spectrum) of phase impedance in the domain of t', where a reflection due to a change of electrical parameters of the cable at location x=200 m from cable start is visible as a frequency component at x=200. This spike is in the case of FIG. 4, due to a capacity change of 20 pF in a 30 cm segment of the cable under test.

When condition monitoring a cable, a number of discontinuities (n) in the electrical parameters of the cable may be present. Each of these discontinuities will appear in the power spectrum as distinct frequency components spikes f'', and their positions $x_n$ identified as explained above.

In order to have good sensitivity and digital resolution, it is important to operate with the highest possible bandwidth, which is however limited by the cable attenuation. Typical examples of bandwidth are 100 MHz bandwidth for 30 m cables ( ) and 20 KHz bandwidth for cables up to 120 kmj ( ) Long cables require narrow bandwidths to overcome the increasing cable attenuation, which is a function of frequency.

Global Degradation Monitoring

Monitoring of global changes in the cable condition is provided by:
Method 1: Relative Phase Velocity estimation and monitoring.
Method 2: CBAC method (Central Band Attenuation Correlation)

As for the local degradation and diagnosis, the method for global degradation is also based on applying a reference signal CH0 to the cable, the reference signal having a frequency bandwidth from $w_1$ to $w_2$, which is then phase and amplitude modulated by the cable impedance $Z_{DUT}$ of the cable under test, providing the signal CH1.

Method 1: The Relative Phase Velocity is calculated by LIRA through a two step process:
1. A first approximate value is estimated using 2 consecutive resonance frequency values in the line impedance, applying the following equations: At any resonance, the cable length L is exactly equal to half wavelength or any multiple of that (this is true when the cable is open ended, but different load reactances can be easily accounted for), or, using Eq. (1):

$$L = \frac{v_r v_0}{2 f_k} k \quad (24)$$

where L is the cable length, $v_0$ is the light speed in vacuum, $v_r$ is the relative phase velocity and $f_k$ is the $k^{th}$ resonance peak frequency.

Applying Eq. (24) to two consecutive resonance peaks, we get:

$$v_r = 2L(f_{k+1} - f_k)/v_0. \quad (25)$$

Eq. (25) is used by LIRA to evaluate a first value of $v_r$, after the estimation of the cable input impedance and the calculation of the resonance frequencies. Note that any load reactance shift would be eliminated by the difference term in the equation. The reason why this value is approximate is that $v_r$ is a slow function of f, but it has been assumed constant in Eq. (25).

2. The value of $v_r$ found in step 1 is used to calculate the approximate value of the fundamental frequency f' (domain of t', see description above and FIG. 3), as:

$$f' = \frac{2L}{v_r v_0} \quad (26)$$

LIRA searches the maximum peak f'' in the Fourier transform (power spectrum) in the domain of t', in a user selectable interval around f'. When an accurate value of f' (called f'') is found from the spectrum, Eq. (19) is solved for $v_r$ as:

$$v_r^{final} = \frac{2L}{v_0 f''} \quad (27)$$

which is the final and accurate value of the phase velocity. The phase velocity decreases with the degradation of the cable insulation.

Method 2: CBAC method (Central Band Attenuation Correlation)

$$\Gamma_d = A e^{-j\omega' t'} \quad (18)$$

Figure 5:
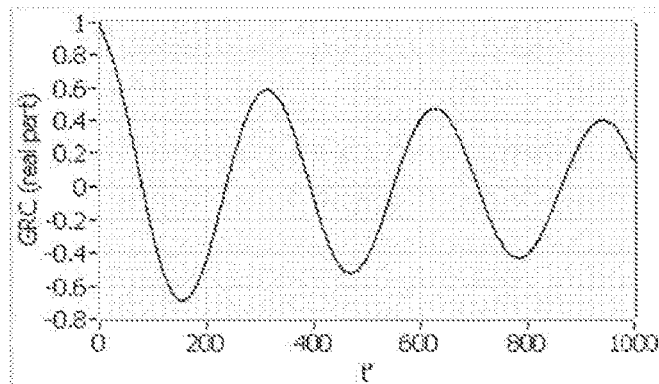
FIG. 5 is a signal resulting from the real part of equation (18), which is a dumped sine wave of radial frequency ω' and amplitude A in the domain of t'.

Equation (18) is the equation (in complex notation) of a sine wave of radial frequency ω' and amplitude A (considering only the real part of the complex function in eq. 18), in the domain of t'. If the attenuation α is not 0, A is a decaying constant and the resulting signal is a dumped sine wave as shown in FIG. 5. FIG. 5 shows the GRC (real part) as a function of t'.

Writing eq. (8) for the input line impedance Z using eq. (18) for $\Gamma_d$, we get:

$$Z = Z_0 \frac{1 + A e^{-j\omega' t'}}{1 - A e^{-j\omega' t'}} \quad (27)$$

Equation (27) is a complex function representing the amplitude and phase of the line impedance Z at distance d from the cable end. Plotting the phase of the line impedance Z in the domain of t' when A=1 (zero attenuation and termination open or shorted), provides the graph as shown in FIG. 6.

Figure 6:
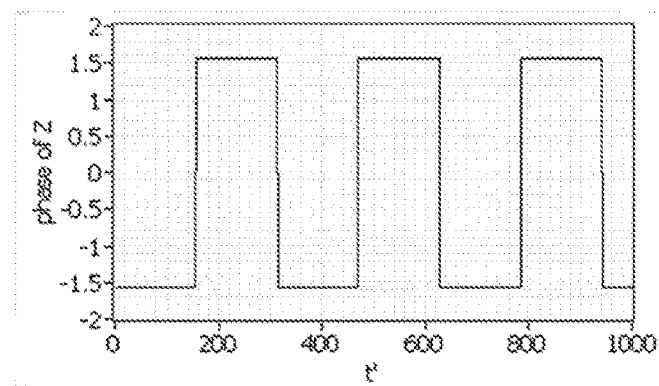
FIG. 6 is a plot of the phase of Z in the domain of t' for A=1 in equation (19)
Figure 7:
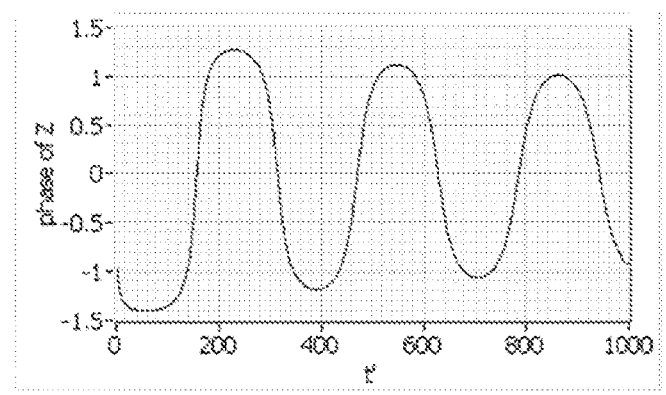
FIG. 7 is a plot of a semi periodic function of the phase function (18)

The plot in FIG. 6 is a square wave of radial frequency ω' (eq. 16) and amplitude π/2. If the attenuation α is not zero (the real case), so that A is less than 1 and decaying to zero as t' moves toward infinity, the shape of the phase of function (16) moves toward a semi periodic function with the same frequency ω', as shown in FIG. 7.

The reason for this change can be explained if we write the equation of a square wave in Taylor's series:

$$f(x) = \frac{4}{\pi} \sum_{n=1,3,5,...} \frac{1}{n} \sin\left(\frac{n\pi x}{d}\right) \quad (28)$$

Figure 8:
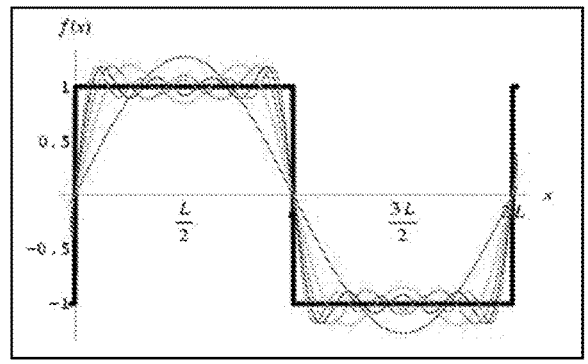
FIG. 8 is a plot of the components of the function f(x) in equation (28)

Eq. (28) is the infinite sum of the odd harmonics starting with the fundamental sine wave of period 2d. FIG. 8 plots these components and the final result. Physically speaking, in a transmission line the fundamental sine wave of period 2d correspond to the first reflection from the cable termination. The harmonic components are due to higher order reflections and their amplitude (in the domain of t') decrease with the term 1/n, where n is the harmonic order. For this reason when the attenuation term is not considered (as in eq. (28)), the infinite number of reflections result in a square impedance phase, as shown in FIG. 6 or FIG. 8.

The addition of the attenuation term results in a progressive attenuation of the amplitude of the harmonics, having as a consequence that the fundamental wave increases its importance in respect to the higher harmonics (FIG. 7). Including the attenuation term (and the reflection coefficient, if the termination is not open or shorted), eq. (28) becomes:

$$f(x) = \frac{4}{\pi} \sum_{n=1,3,5,...} \frac{1}{n} \sin\left(\frac{n\pi x}{d}\right) \Gamma_R^n e^{-2\alpha dn} \quad (29)$$

Integrating along d and converting in dB units, we arrive at:

$$\alpha_{dB/km} = \frac{((TP_1 - TP_3)_{dB} - 9.54 + 20\log(\Gamma_R^2))}{d} 250 \quad (30)$$

Where TP1 and TP2 are the amplitudes of the fundamental and third harmonics of the impedance phase and a the cable attenuation per unit of length at the middle of the bandwidth. When the cable termination is shorted or open, the reflection coefficient is 1 (or −1), so that the log term in eq. (30) disappears.

Figure 9:
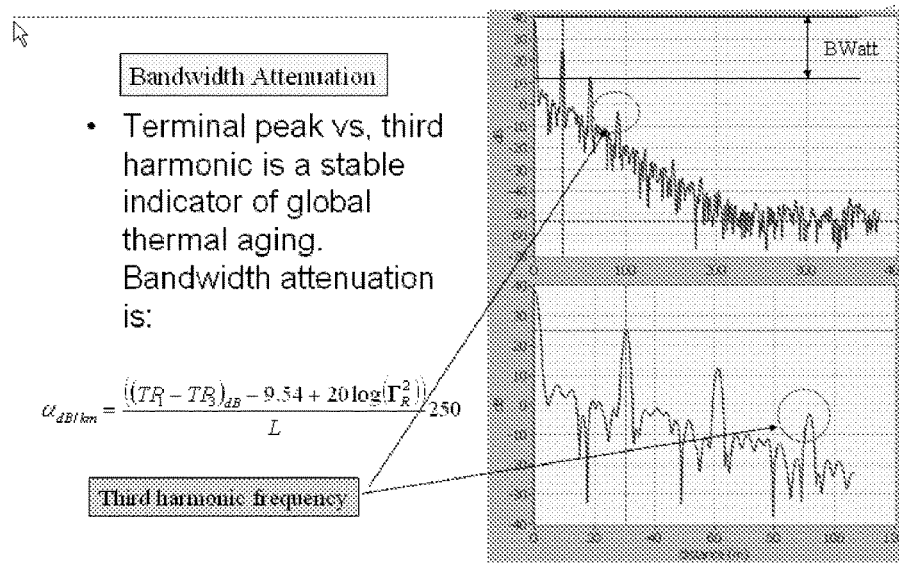
FIG. 9 shows an example of a LIRA display of the first three harmonics of equation (29) according to an embodiment of the present invention.

Eq. (30) shows that the mid-bandwidth cable attenuation is proportional to the difference of TP1 and TP2, which LIRA can estimate with accuracy. FIG. 9 shows an example of LIRA display of the first 3 harmonics. The terminal peak vs third harmonic is thus a stable indicator of global thermal aging of the cable.

Extensive tests at EPRI and TECNATOM demonstrate that a good correlation exists between the thermal aging condition of a cable (especially for EPR insulated cables) and its mid-band attenuation.

These tests show also that the low frequency attenuation is practically unchanged, the characteristic impedance is almost unchanged (with large standard deviation) and the phase velocity tends to decrease (with large standard deviation). The mid-band attenuation was found to be larger for unaged cables, in all cases.

These results seem to confirm that thermal ageing produce a significant increase in the cable inductance, together with some change in the dielectric capacitance.

In LIRA α is normalized to a reference cable length (by default 20 m), to take care of the differences between long and short cables.

Attenuation α is given by:

$$\alpha = K\frac{R}{2}\sqrt{\frac{C}{L}} \quad (31)$$

Where R is the wire resistance (invariant with ageing), C the insulation capacitance and L the cable inductance.

Equation (31) shows that attenuation α is a function of the ratio between the insulation capacitance C and the cable inductance L, which exhibit a change with aging. The resultant correlation between aging and a might be complex and not monotonic, while monotonic behavior is an important requirement for an aging indicator.

To solve this problem, the attenuation value is corrected using the characteristic impedance and the phase velocity ratio, both calculated by LIRA.

When α is divided by the characteristic impedance Z0 and for the square of the relative phase velocity VR, we have:

$$\alpha = K\frac{R}{2}\sqrt{\frac{C}{L}} \div \sqrt{\frac{L}{C}} \div \left(\frac{K'}{\sqrt{LC}}\right)^2 = K''C^2 = CBAC \quad (32)$$

CBAC is then an indicator sensitive only to changes in the insulation capacitance.

If we multiply, instead for the square of VR:

$$\alpha = K\frac{R}{2}\sqrt{\frac{C}{L}} \div \sqrt{\frac{L}{C}} \times \left(\frac{K'}{\sqrt{LC}}\right)^2 = K''L^{-2} \quad (33)$$

The inverse of it is CBAL, an indicator sensitive only to changes in the cable inductance.

Figure 10:
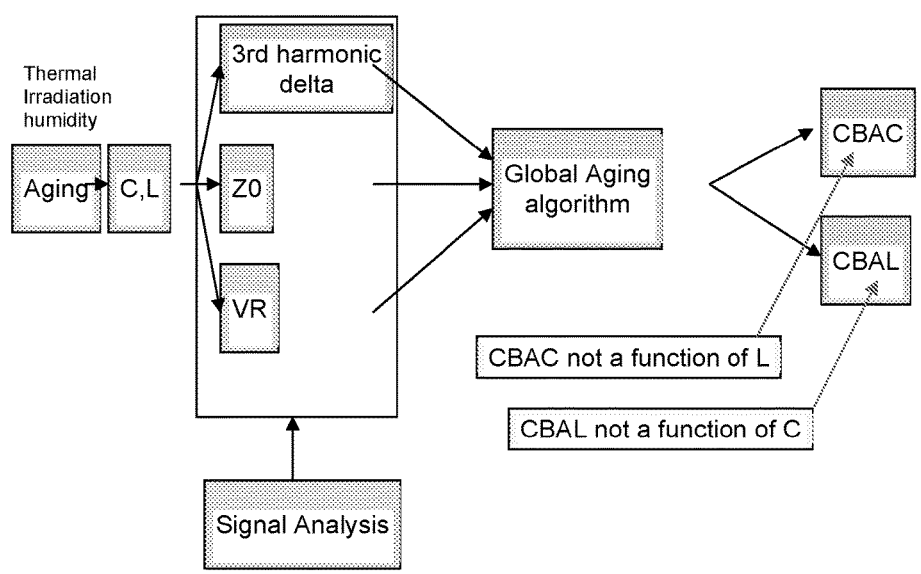
FIG. 10 is a schematic illustration of the effects of C and L on the LIRA aging indicators according to an embodiment of the present invention.

FIG. 10 illustrates the concept of the isolation effects of the insulation capacitance C and the cable inductance L on the LIRA aging indicators.

Spectral Decomposition of Cable Impedance Changes: Real-Imaginary Relationship in Phase Impedance Spectrum to Calculate Spot Direction and Size (the BTS Approach)

As explained in detail above, the Line Resonance Analysis System disclosed in U.S. Pat. No. 7,966,137B2 provides a LIRA Signature. An example of a LIRA signature is shown in FIG. 11. The LIRA Signature tracks changes in cable impedance along the cable. The LIRA Signature is a power spectrum transformed to a function of distance from the beginning of the cable to which the CH0 signal is applied.

As shown in FIG. 11 the LIRA Signature has identified a change in the cable impedance in positions a and b in FIG. 11. The LIRA resolution is shown by the vertical lines in FIG. 11. However, as the LIRA only detects changes in the cable impedance, the LIRA Signature as shown in FIG. 11 is silent about the cable condition between the two cable impedance changes as identified in a and b. As also the impedance changes are within the resolution of the LIRA system, further information of the nature of the impedance change may not be provided by the prior art LIRA system in U.S. Pat. No. 7,966,137B2.

Cable impedance increases (step-up) as a result of a change in one or more of the following parameters:
1. Dielectric capacitance decrease
2. Cable self-inductance increase
3. Conductor or/and shield resistivity increase
4. Insulation conductivity decrease (rare)

The effects 1 and 2 are more sensitive at high frequency, whereas the effects from 3 and 4 are more sensitive at low frequency.

Cable impedance changes in the opposite direction cause an impedance decrease (step-down).

Frequent factors for impedance changes are:
Temperature increase (decrease) (dielectric capacitance up (down), impedance down (up))
Water/moisture intrusion (dielectric capacitance up, impedance down)
Insulation resistance down (conductivity up, impedance down)
Mechanical impact (any direction)
Gamma irradiation (normally impedance up)

A problem with the LIRA Signature, as described in U.S. Pat. No. 7,966,137B2, is that a spike in the signature may be caused by any of the following factors listed below. The different factors are identified by an event name. This event name will be used throughout the rest of the description.

The resolution of LIRA is a function of the applied bandwidth and it is about 1.5 m at 100 MHz. The resolution is decreasing as the bandwidth is reduced.

1. SP+ (single peak, positive): A step-up change in impedance. This situation occurs when there is a stable increase of the cable impedance for a distance longer than the actual resolution. This is illustrated in FIGS. 11 and 12 Feil! Fant ikke referansekilden. FIG. 11 illustrates the LIRA Signature from a segment of a cable with higher impedance, and where this segment is longer than the resolution of the LIRA. At the beginning of the segment there is an impedance change (impedance steps up (SP+)) within the resolution of the LIRA Signature. The impedance step up results in a spike in the LIRA Signature, as the LIRA Signature detects only changes in the impedance along the cable. At the end of the segment, there is another impedance change, where the impedance steps down (SP−) and again results in a spike in the LIRA Signature. FIG. 12 shows a display image of a LIRA Signature for an impedance step-up (−5 pF/m, resolution=1.5 m) as illustrated in FIG. 11. The impedance step up is represented by the first peak at 50 m and the impedance step down appears at 60 m from cable start.

2. SP− (single peak, negative): A step-down change in impedance. This situation occurs when there is a stable decrease of the cable impedance for a distance longer than the actual resolution of LIRA. FIGS. 13 and 14 show an example of a long segment (relatively to the bandwidth) of lower impedance. The two spikes in FIG. 13 represent the beginning and end of the low impedance segment. At the beginning of the segment there is an impedance change (impedance steps down (SP−)) within the resolution of the LIRA Signature. The impedance step-down results in a spike in the LIRA Signature, as the LIRA Signature detects only changes in the impedance along the cable. At the end of the segment, there is another impedance change, where the impedance steps up (SP+) and again results in a spike in the LIRA Signature. As can be seen from the Figures, the LIRA signature in FIG. 14 is identical to the LIRA signature in FIG. 12. Both a cable impedance increase and a cable impedance decrease over a distance longer than the resolution for the actual applied bandwidth of the CH0 signal applied to the cable, result in the same LIRA signature; i.e. that is a SP− spike followed by a SP+ spike.

3. DP+: A short cable segment (shorter than the actual resolution) with a higher impedance. This is what is normally called a "spot". In this event the cable impedance is the same before and after the spot, but it is higher inside the short cable segment. See FIG. 19 for an example of high impedance spot and FIG. 26 for the corresponding LIRA signature. As can be seen from FIG. 19 a high impedance spot results in one spike only in the LIRA signature.

4. DP−: A short cable segment (shorter than the actual resolution) with a lower impedance. In this event the cable impedance is the same before and after the spot, but it is lower inside the short cable segment. See FIG. 20 for an example of high impedance spot and FIG. 23 for the corresponding LIRA signature. As can be seen from FIG. 20 a high impedance spot results in one spike only in the LIRA signature.

As can be seen from FIGS. 11, 13, 19 and 20 the different impedance changes described above results in the same spike in the LIRA signature. In summary, there are four event types that the normal LIRA signature thus cannot discriminate:

SP+: step-up impedance change. This also includes the final termination, when the cable is open ended (or the attached load has an impedance higher than the cable characteristic impedance).
SP−: step-down impedance change. This also includes the final termination, when the cable is short ended (or the attached load has an impedance lower than the cable characteristic impedance).
DP+: High impedance spike
DP−: Low impedance spike The Real-Imaginary Relationship (BTS, Balanced Termination Signature) Approach to Detect the Four Possible Events A Real-Imaginary Relationship (BTS, Balanced Termination Signature) approach may be used to detect the four possible events listed above (SP+, SP−, DP+, DP−). As it follows from eq. (8) the line impedance $Z_{DUT}$ is a complex variable. The shape of the curve that follows from eq. (8) is shown in FIG. 1 for amplitude and phase as a function of frequency.

The present invention provides further analyses of the spikes identified at particular positions in the Fourier transform of the impedance phase, the position of which are calculated by eq. (23) and e.g. shown in FIGS. 3 and 4.

The BTS approach is based on a calculation of a real and an imaginary component of the impedance phase spectrum Fourier transform, at the position of the event.

The step-up and step-down (SP+ and SP−) events are characterized by a pure imaginary value of the transform at the event position, as described in FIGS. 15 to 18. While the real component is 0 (Re=0), the imaginary component (Im=+90) is positive for a SP+ event and negative (Im=−90) for a SP− event.

The high and low impedance spikes are characterized by a close combination of two SP events of opposite sign; SP+ followed by SP−, or SP− followed by SP+. This results in the imaginary components (+90+−90, −90++90) being cancelled out. The result of this is a pure real value of the spectrum transform at the event position with a positive real component for DP+(FIG. 25) and a negative real component for DP−(FIG. 22).

The impedance phase spectrum Fourier transform for a DP− event is shown in FIG. 21. The spectrum at the spot is purely real and negative. The impedance phase spectrum Fourier transform for a DP+ event is shown in FIG. 24. The spectrum at the spot is purely real and positive.

These calculations may be performed automatically by the LIRA system according to the invention. As is shown in the display images in FIGS. 12, 14, 23 and 26, the impedance spikes in the LIRA signatures are presented in a table on the display image identifying each spike as one of SP+, SP−, DP+, DP−.

Location Accuracy for SP and DP Events

There are however some differences in the localization process between the two SP steps events (SP+, SP−) and the two DP spike events (DP+, DP−).

The detected location of a SP+(step-up) event is the cable position where one or more electrical parameters change resulting in an increase in the cable impedance. Similarly, the location of a SP− event is the position on the cable where the local impedance decreases.

A DP+(DP−) event is the superimposition of a SP+(SP−) event followed by a SP−(SP+) event at a distance closer than the current resolution resulting from the applied bandwidth of the signal CH1 applied to the cable. For this reason, the detected event location is in the middle of the short segment where the change occurs.

Local Degradation Severity (DNORM Algorithm)

The severity of the local degradation in the cable insulation is correlated to the spike heights in the LIRA signature. However, the spike height for the same damage to the insulation, also depends on the position of this cable degradation (insulation damage) along the cable. The height of the spike in the LIRA signature decreases with the distance of the cable degradation from the beginning of the cable to which the signal CH0 is applied. This means that as the fault moves towards the end of the cable, the height of the spikes decreases. This effect was also automatically compensated for in the analyses performed by the LIRA system as described in U.S. Pat. No. 7,966,137B2 through plot normalization.

Such normalization is a good feature for detecting easily significant spikes, but it is not reliable as a distance compensation as the fault (cable insulation degradation) moves towards the end of the cable. The present invention provides a DNORM algorithm which may be expressed as follows:

Any local spot (change in cable impedance) produces a specular image on the other side of the terminal peak (see FIG. 27). This is due to a second order reflection of the damaged section. The second order spike in the power spectrum is like a new spot of the same severity at a distance 2L−SL, where L is the cable length and SL is the spot location on the cable.

Since the distance between the two spots (a local spot and its specular image) is known (after the spot localization), it is possible to draw and calculate a trendline (the straight line between the spots in FIG. 27) that represents how the spike size changes with the distance, due to the cable attenuation. In DNORM the difference between the value of the trend line and the termination spike (spike delta) is normalized to the termination position (TP), regardless of where the real spot is located. This difference (DNORM) represents a measure of the severity of the local degradation for the particular spot.

Termination End

The broadband signal CH0 applied to the cable is reflected at the termination end of the cable. The signal from the termination end provides a spike in the spot signature at a distance from start of the cable being the cable length. Any impedance changes occurring at the end of the cable is thus within the shadow of this termination spike/peak. The present invention using the BTS and DNORM approach as explained above provides the possibility to establish whether the termination end of the cable segment is of good or bad quality. The termination end of the cable provides a spot (DP+ or DP−). At the cable termination, the relation between the delta difference dy between the two sides of the termination peak and the peak height dz; BTS=dy/dz*100 is a measure of the condition of the insulation of the cable termination.

FIG. 28 shows a display image of a Balanced termination Signature (BTS) at a cable end for a cable in balancing conditions (good cable) where BTS=0. FIG. 29 shows a display image of a Balanced termination Signature (BTS) at a cable end for a cable with a high capacitance (low impedance) termination, where (BTS>0). FIG. 30 shows a display image of a Balanced termination Signature (BTS) at a cable end for a cable with a low capacitance (high impedance) termination, where BTS<0.

Establishing the condition of the cable end is particularly important in environments as e.g. oil and gas industry, downhole in oil wells, subsea, nuclear power plants, power transmission distribution and other hard to reach locations.

Having described preferred embodiments of the invention it will be apparent to those skilled in the art that other embodiments incorporating the concepts may be used. These and other examples of the invention illustrated above are intended by way of example only and the actual scope of the invention is to be determined from the following claims.

The invention claimed is:

1. A method for monitoring a condition of an electrical cable, said method comprising:

applying, by a signal generator, a broadband signal wave to a first end of the electrical cable, wherein the broadband signal wave is phase and amplitude modulated by at least a cable impedance of the electrical cable, acquiring, by an acquisition module, at the first end of the cable the phase and amplitude modulated broadband signal wave transmitted and reflected by the electrical cable, calculating, by an analyzer, a complex cable impedance $Z_{DUT}$ as a function of frequency f specified by an amplitude and a phase, for the acquired reflected broadband signal wave, translating, by the analyzer, the calculated complex cable impedance into a time domain t';

calculating, by the analyzer, a frequency f' in the time domain t', wherein the frequency f' is the fundamental frequency of a pseudo-periodic function of radial frequency w' and amplitude A in the time domain t' due to wave reflection of the broadband signal wave at a distance d from an end of the cable, and wherein the frequency f' is calculated by applying:

$$f' = \frac{\omega'}{2\pi} = \frac{2d}{v_r v_0}$$

in which $v_0$ is the speed of light in a vacuum and $v_r$, is an estimated relative phase velocity of an electrical signal in the cable;

performing, by the analyzer, a power spectrum analysis of both amplitude and phase of the complex cable impedance in the time domain t' to find and localize any local degradation to the insulation of the cable;

identifying, by the analyzer, frequency components $f''_1$, $f''_2$, $f''_n$ in the power spectrum of the time domain t' due to wave reflections of the broadband signal wave at locations $x_1, x_2, \ldots, x_n$ along the cable, the wave reflections being due to discontinuities in electrical parameters of the cable;

calculating, by the analyzer, each of the locations $x_i$ by applying:

$$x_i = \frac{v_r v_0 f_i''}{2};$$

establishing, by the analyzer, a relationship between a real and an imaginary part of a phase impedance spectrum Fourier transform of the power spectrum in an interval around at least one of the locations $x_1, x_2, \ldots, x_n$ along the cable;

identifying, by the analyzer, impedance changes in at least one of the locations $x_1, x_2, \ldots, x_n$ along the cable from said real and imaginary part;

displaying, by a display, the identified impedance changes in at least one of the locations $x_1, x_2, \ldots, x_n$ as a function of cable length on a display for visual representation of the condition of the cable; and analyzing, by the analyzer, the visual representation of the identified impedance changes to identify a cause of the impedance change of the cable in at least one of the locations $x_1, x_2, \ldots, x_n$ on the cable.

2. The method of claim 1, wherein identifying impedance changes includes identifying at least one of a step up impedance change, a step down impedance change, a high impedance spot or a low impedance spot.

3. The method of claim 1, wherein a high impedance spot is identified when the imaginary part is zero and the real part is positive.

4. The method of claim 1, wherein a low impedance spot is identified when the Imaginary part is zero and the real part is negative.

5. The method of claim 1, wherein a step up impedance change is identified when the real part is zero and the imaginary part is positive.

6. The method of claim 1, wherein a step down impedance change is identified when the real part is zero and the imaginary part is negative.

7. The method of claim 1, further comprising identifying a cable segment with a lower impedance as a step-down impedance change in the beginning of the cable segment followed by a step-up impedance change at the end of the cable segment.

8. The method of claim 1, further comprising identifying a cable segment with a higher impedance as a step-up impedance change in the beginning of the cable segment followed by a step-down impedance change at the end of the cable segment.

9. A method for monitoring a condition of an electrical cable, said method comprising:

applying, by a signal generator, a broadband signal wave to a first end of the electrical cable, wherein the broadband signal wave is phase and amplitude modulated by at least a cable impedance of the electrical cable, acquiring, by an acquisition module, at the first end of the cable the phase and amplitude modulated broadband signal wave transmitted and reflected by the electrical cable, estimating/calculating, by an analyzer, a complex cable impedance $Z_{DUT}$ as a function of frequency f specified by an amplitude and a phase, for the acquired reflected broadband signal wave, translating, by the analyzer, the calculated complex cable impedance into a time domain t';

calculating, by the analyzer, a frequency f' in the time domain t', wherein the frequency f' is the fundamental frequency of a pseudo-periodic function of radial frequency w' and amplitude A in the time domain t' due to wave reflection of the broadband signal wave at a distance d from an end of the cable, and wherein the frequency f' is calculated by applying:

$$f' = \frac{\omega'}{2\pi} = \frac{2d}{v_r v_0}$$

in which $v_0$ is the speed of light in a vacuum and $v_r$ is an estimated relative phase velocity of an electrical signal in the cable;

performing, by the analyzer, a power spectrum analysis of both amplitude and phase of the complex cable impedance in the time domain t' to find and localize any local degradation to the insulation of the cable;

identifying, by the analyzer, frequency components $f''_1, f''_2, \ldots f''_n$ in the power spectrum of the time domain t' due to wave reflections of the broadband signal wave at locations $x_1, x_2, \ldots, x_n$ along the cable, the wave reflections being due to discontinuities in electrical parameters of the cable;

calculating, by the analyzer, each of the locations $x_1$ by applying:

$$x_i = \frac{v_r v_0 f_i''}{2};$$

displaying, by a display, a visual representation of the identified frequency components of the power spectrum as a function of a length of the cable;

establishing, by the analyzer, a local degradation severity of an identified fault in the cable insulation in at least one of the locations $x_1, x_2, \ldots, x_n$ along the cable by analyzing a second order reflection of the broadband signal in said identified fault location; and displaying, by the display, a visual representation of the local degradation severity of the insulation in said identified fault location.

10. The method according to claim 9, further comprising establishing a difference between a height of a first order reflection peak and the height of the second order reflection peak in the power spectrum and to evaluate the cable attenuation in order to normalize the height of any peak at any distance from the termination.

11. The method according to claim 1, further comprising establishing a measure of the condition of the insulation of cable termination by analyzing a termination peak in the power spectrum, comprising establishing a relationship between the difference dy between the two valleys on each side of the termination peak and a height dz of the termination peak and displaying a visual representation of the condition of the cable termination.

12. The method of claim 11, further comprising:
estimating, using the analyzer, the estimated relative phase velocity $v_r$, wherein the estimating the estimated relative phase velocity $v_r$ includes:
evaluating at least two resonance frequencies of the complex cable impedance $Z_{DUT}$;
identifying two consecutive resonance frequency values $f_k$ and $f_{k+}$ respectively, of the complex cable impedance $Z_{DUT}$;

calculating a first value of a relative phase velocity $v_r$ of the cable by applying $$v_r = 2L(f_{k+1}-f_k)/v_0,$$

where L is the length of the cable;

calculating the fundamental frequency f' of the cable, in the time domain t' using the first relative phase velocity $v_r$ and applying $$f' = \frac{2L}{v_r v_0};$$

calculating a second value f" of the fundamental frequency f' by finding a maximum peak value in the time domain t' in a selectable interval around f'; and calculating the estimate of the relative phase velocity $v_r^{final}$ by applying $$v_r^{final} = \frac{2L}{v_0 f''}.$$

13. A system for monitoring a condition of an electrical cable, said system comprising:

an analyzer for calculating a complex cable impedance $Z_{DUT}$ as a function of a frequency f specified by an amplitude and phase;

a generating circuit for generating a broadband signal wave that is to be phase and amplitude modulated by a cable impedance, the broadband signal wave being applied to a first end of the cable;

an acquisition module for acquiring at the first cable end the broadband signal wave phase and amplitude modulated by the cable impedance;

a translating circuit for translating the complex cable impedance $Z_{DUT}$ into a time domain t', an analyzer for calculating a frequency f' in the time domain t', wherein the frequency f' is the fundamental frequency of a pseudo-periodic function of radial frequency ω' and amplitude A in the time domain t' due to wave reflection of the broadband signal wave at a distance d from an end of the cable, and wherein the frequency f' is calculated by applying:

$$f' = \frac{\omega'}{2\pi} = \frac{2d}{v_r v_0}$$

in which $v_0$ is the speed of light in a vacuum and $v_r$ is an estimated relative phase velocity of an electrical signal in the cable, wherein said analyzer performs a power spectrum analysis of both amplitude and phase of the complex cable impedance in the time domain t' to find and localize any local degradation to insulation of the cable, wherein said analyzer identifies frequency components $f''_1, f''_2, \ldots f''_n$ in the power spectrum of the time domain t' due to wave reflections at locations $x_1, x_2, \ldots, x_n$ along the cable, the wave reflections being due to discontinuities in electrical parameters of the cable, wherein said analyzer calculates each of the locations $x_i$ by applying:

$$x_i = \frac{v_r v_0 f''_i}{2},$$

wherein said analyzer establishes a relationship between a real and an imaginary part of a phase impedance spectrum Fourier transform of the power spectrum in an interval around at least one of the locations $x_1, x_2, \ldots, x_n$ along the cable, wherein said analyzer identifies impedance changes in at least one of the locations $x_1, x_2, \ldots, x_n$ along the cable from said real and imaginary part, wherein a display displays the identified impedance changes in at least one of the locations $x_1, x_2, \ldots, x_n$ as a function of cable length on a display for visual representation of the condition of the cable, and wherein said analyzer analyzes the visual representation of the identified impedance changes to identify a cause of the impedance change of the cable in at least one of the locations $x_1, x_2, \ldots, x_n$ on the cable.

14. The system of claim 13, wherein identifying impedance changes includes identifying at least one of a step up impedance change, a step down impedance change, a high impedance spot or a low impedance spot.

15. The system of claim 13, wherein a high impedance spot is identified when the Imaginary part is zero and the real part is positive.

16. The system of claim 13, wherein a low impedance spot is identified when the Imaginary part is zero and the real part is negative.

17. The system of claim 13, wherein a step up impedance change is identified when the real part is zero and the imaginary part is positive.

18. The system of claim 13, wherein a step down impedance change is identified when the real part is zero and the imaginary part is negative.

19. The system of claim 13, further comprising identifying a cable segment with a lower impedance as a step-down impedance change in the beginning of the cable segment followed by a step-up impedance change at the end of the cable segment.

20. The system of claim 13, further comprising identifying a cable segment with a higher impedance as a step-up impedance change in the beginning of the cable segment followed by a step-down impedance change at the end of the cable segment.

21. The system of claim 13, further comprising establishing a local degradation severity of an identified fault in the cable insulation in at least one of the locations $x_1, x_2, \ldots, x_n$ along the cable by analyzing a second order reflection of the broadband signal in said identified fault location.

22. The system according to claim 21, further comprising establishing a difference between a height of a first order reflection peak and the height of the second order reflection peak in the power spectrum and normalizing the height difference to a height of a termination peak in the power spectrum.

23. The system according to claim 13, further comprising establishing a measure of the condition of the cable end by analyzing a termination peak in the power spectrum, comprising establishing a relationship between the difference dy between the two valleys on each side of the termination peak and a height dz of the termination peak.

24. The system of claim 13,
wherein said analyzer is operable to:
  evaluate at least two resonance frequencies of the complex cable impedance $Z_{DUT}$;
  identify two consecutive resonance frequency values $f_k$ and $f_{k+1}$ respectively, of the complex cable impedance $Z_{DUT}$;
  calculate a first value of a relative phase velocity $v_r$ of the cable by applying $v_r = 2L(f_{k+1} - f_k)/v_0$, where L is the length of the cable;
  calculate the fundamental frequency f' of the cable using the first relative phase velocity $v_r$ and applying $$f' = \frac{2L}{v_r v_0},$$

calculate a second value f" of the fundamental frequency f' by finding a maximum peak value in the time domain t' in a selectable interval around f'; and
  calculate the estimate of the relative phase velocity $v_r^{final}$ by applying $$v_r^{final} = \frac{2L}{v_0 f''}.$$

25. The method according to claim 9, further comprising establishing a measure of the condition of the cable end by analyzing a termination peak in the power spectrum, comprising establishing a relationship between the difference dy between the two valleys on each side of the termination peak and a height dz of the termination peak.

26. The method of claim 25, further comprising:
  estimating, using an analyzer, the estimated relative phase velocity $v_r$, wherein the estimating the estimated relative phase velocity $v_r$ includes:
  evaluating at least two resonance frequencies of the complex cable impedance $Z_{DUT}$;
  identifying two consecutive resonance frequency values $f_k$ and $f_{k+}$ respectively, of the complex cable impedance $Z_{DUT}$;
  calculating a first value of a relative phase velocity $v_r$ of the cable by applying $v_r = 2L(f_{k+1} - f_k)/v_0$, where L is the length of the cable;
  calculating the fundamental frequency f' of the cable, in the time domain t' using the first relative phase velocity $v_r$ and applying $$f' = \frac{2L}{v_r v_0};$$

calculating a second value f" of the fundamental frequency f' by finding a maximum peak value in the time domain t' in a selectable interval around f'; and
  calculating the estimate of the relative phase velocity $v_r^{final}$ by applying $$v_r^{final} = \frac{2L}{v_0 f''}.$$

27. The method according to claim 1, wherein the cause of the impedance change of the cable in at least one of the locations $x_1, x_2, \ldots x_n$ on the cable is due to at least one of the following parameters: temperature increase or temperature decrease;
  water/moisture intrusion into the cable; decrease in insulation resistance; mechanical impact to the cable; and gamma irradiation.

28. The system according to claim 13, wherein the cause of the impedance change of the cable in at least one of the locations $x_1, x_2, \ldots, x_n$ on the cable is due to at least one of the following parameters: temperature increase or temperature decrease;
  water/moisture intrusion into the cable; decrease in insulation resistance; mechanical impact to the cable; and gamma irradiation.

* * * * *